United States Patent
Honmura et al.

(10) Patent No.: US 6,557,150 B1
(45) Date of Patent: Apr. 29, 2003

(54) METHOD OF EXTRACTING TIMING CHARACTERISTICS OF TRANSISTOR CIRCUITS, STORAGE MEDIUM STORING TIMING CHARACTERISTIC LIBRARY, LSI DESIGNING METHOD, AND GATE EXTRACTION METHOD

(75) Inventors: Tetsuroo Honmura, Kokubunji (JP); Takashi Nakajima, Maebashi (JP); Kenzo Goto, Kodaira (JP); Shoichi Watanabe, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/485,169

(22) PCT Filed: Aug. 4, 1998

(86) PCT No.: PCT/JP98/03455
§ 371 (c)(1),
(2), (4) Date: Feb. 7, 2000

(87) PCT Pub. No.: WO99/09497
PCT Pub. Date: Feb. 25, 1999

(30) Foreign Application Priority Data

Aug. 20, 1997 (JP) .............................. 9-223349
Dec. 12, 1997 (JP) .............................. 9-342504

(51) Int. Cl.⁷ .............................................. G06K 17/50
(52) U.S. Cl. ......................................................... 716/6
(58) Field of Search ........................................ 716/1, 6

(56) References Cited

U.S. PATENT DOCUMENTS 6,117,183 A * 9/2000 Teranishi et al. ............. 716/11
6,145,116 A * 11/2000 Tawada ......................... 716/6
6,167,001 A * 12/2000 Wu .............................. 368/113
6,216,256 B1 * 4/2001 Inoue et al. .................... 716/6

FOREIGN PATENT DOCUMENTS

| JP | 4241675 | 8/1992 |
| JP | 4316166 | 11/1992 |
| JP | 618617 | 1/1994 |
| JP | 6174781 | 6/1994 |
| JP | 6348775 | 12/1994 |
| JP | 7287051 | 10/1995 |
| JP | 8221456 | 8/1996 |
| JP | 9153073 | 6/1997 |
| JP | 9179885 | 7/1997 |
| JP | 9198417 | 7/1997 |
| JP | 9259172 | 10/1997 |

OTHER PUBLICATIONS

"Dynamite: An Efficient Automatic Test Pattern Generation System for Path Delay Faults" By Karl Fuchs, et al, IEEE Transaction on CAD, vol. 10, No. 10, Oct. 1991, pp. 1323–1335.

* cited by examiner

Primary Examiner—John F. Niebling
Assistant Examiner—Stacy Whitmore
(74) Attorney, Agent, or Firm—Antonelli, Terry, Stout & Kraus, LLP

(57) ABSTRACT

A method of extracting timing characteristics from transistor circuit data of modularity design products (a module) such as a CPU core in which the extracted timing characteristics are used for the timing verification of a circuit including a module to be extracted and timing constraints when logical synthesis or timing-driven layout is made. Particularly, since conditions fit for a timing rule of the module are included in timing characteristics when timing verification is executed by simulation, verification free of pseudo error is enabled. Also, the configuration of a timing characteristic library, a storage medium storing it and an LSI designing method using the storage medium are provided.

6 Claims, 34 Drawing Sheets

Tr. CIRCUIT

| | SUBCIRCUIT NAME 41 | TERMINAL NAME 42 | | | | | | | | | | | NMOS TRANSISTOR 4021 |
|---|---|---|---|---|---|---|---|---|---|---|---|---|---|
| .subckt | EXSMPI | CKM | C | D1 | D2 | D3 | D4 | R1 | R2 | R3 | O1 | O2 | O3 |
| MXX1 | CKI | | CKM | | | | VDD1 | | | VDD1 | penh | 1=1u w=20u | |
| MXX2 | CKI | | CKM | | | | GND1 | | | GND1 | nenh | 1=1u w=20u | |
| .ENDS | | | | | | | | | | | | | |

43 ELEMENT NAME
44 DRAIN
45 GATE
46 SOURCE
47 DEVICE MODEL
4011 PMOS TRANSISTOR

AUXILIARY INFORMATION penh=PMOS, nenf=NMOS  — 48 INFORMATION FOR PMOS/NMOS DISTINCTION

VDD1=POWER, GND1=GND — 49 POWER/GND SIGNAL NAME

INFORMATION FOR SEARCHING ASSOCIATED CIRCUIT : multi_drive=MUL — 40

(b)

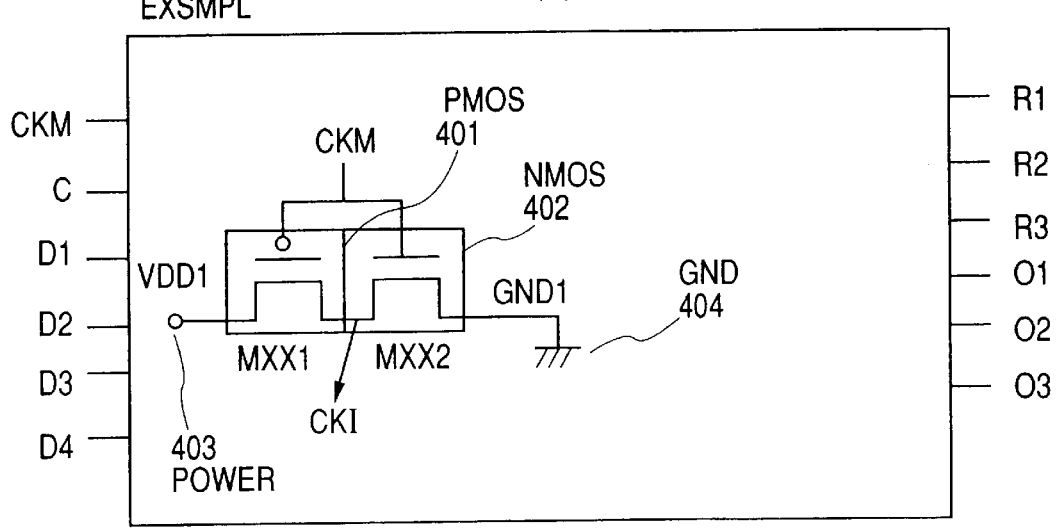

FIG. 6

51 TIME SCALE : UNIT TIME AND PRECISION

`timescale 1ns/1ps`

52 INTERFACE

```
module ADCH8S2(CKM, PDB8, ADCH0, ADCH1, ADCH2,
        ........., LFADIN,......., TMADTGN, TRGAN, VDDREF);
input   CKM, PDB8, ADCH0, ADCH1, ADCH2, IORDN1, IOWRN1;
output  LFADIN;...........
```

53 CALLING FUNCTION MODEL IN LOWER-LEVEL HIERARCHY

```
ADCH8S2_core SG_0(.CKM(CKM), .PDB8(PDB8),
        .ADCH0(ADCH0), .ADCH1(ADCH1), .ADCH2(ADCH2),
        ......., .LFADIN(LFADIN_0),......,
        .TMADTGN(TMADTGN), .TRGAN(TRGAN), .VDDREF(VDDREF));
```

54 TIMING CHARACTERISTIC LIBRARY

55 LOGIC ELEMENTS FOR RULE ADAPTABILITY CONDITION

```
and     SG_6(PDB8,ADCH0,C_C_1);
not     SG_11(C_C_2, IORDN1);
or      SG_12(C_C_1, C_C_2, ADCH1);
...............
``` specify

56 TIMING RULE CHECK PART

```
$setup  (PDB8, negedge CKM &&& C_C_1, 1.572000);
...............
$hold   (negedge CKM &&& C_C_8, PDB8, 2.128000);
...............
```

57 OUTPUT DELAY PART

```
(CKM*>LFADIN)=    (1.302, 1.590);
..........
``` endspecify endmodule

FIG. 8
(a)
TRANSFORMATION OF GATES WITH CROSS TYPE PATTERN
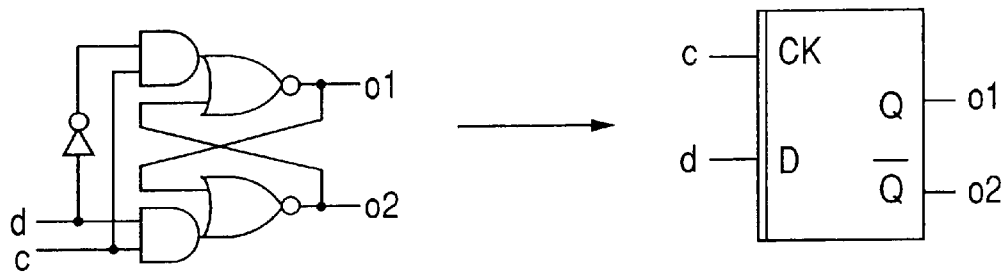
(b)
TRANSFORMATION OF GATES WITH TRI-STATE LOOP TYPE PATTERN
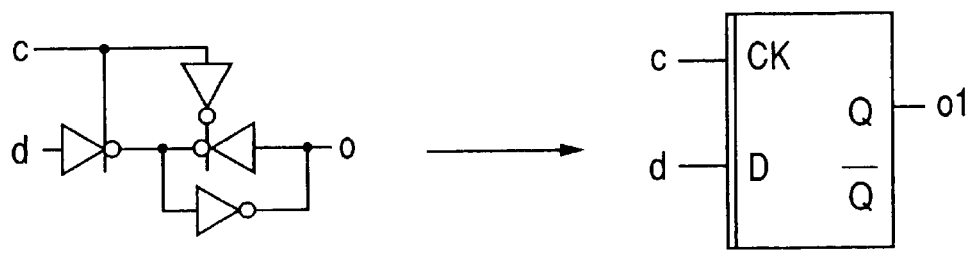

FIG. 10

| SIGNAL TYPE | SEARCH FOR 1stFFs | SEARCH FOR CLOCK ASSOCIATED CIRCUITS | SEARCH FOR DATA ASSOCIATED CIRCUITS |
|---|---|---|---|
| TERMINAL | GO BACK BY ONE GATE AND SEARCH IN ANOTHER DIRECTION | THIS SIGNAL IS END POINT, GO BACK BY ONE GATE AND SPARCH IN ANOTHER DIRECTION | ← |
| FF TERMINAL (INCLUDES TRI-STATE ELEMENTS) | WHEN FF IS SYNCHRONOUS AND FF TERMINAL IS FFd, THIS FF IS 1stFF<br><br>OTHERS SEARCH IN OTHER FAN-OUT DIRECTION | CONTINUE SEARCH UP TO FIRST SYNCHRONOUS FF WITH CLOCK IN DIRECTION OF FFck | END POINT |
| MULTIDRIVEN SIGNAL*1 | GO BACK BY ONE GATE AND SEARCH IN ANOTHER DIRECTION | ← | ← |
| VCC/GND/ FLOATING | GO BACK BY ONE GATE AND SEARCH IN ANOTHER DIRECTION | THIS SIGNAL IS END POINT, GO BACK BY ONE GATE AND SEARCH IN ANOTHER DIRECTION | ← |

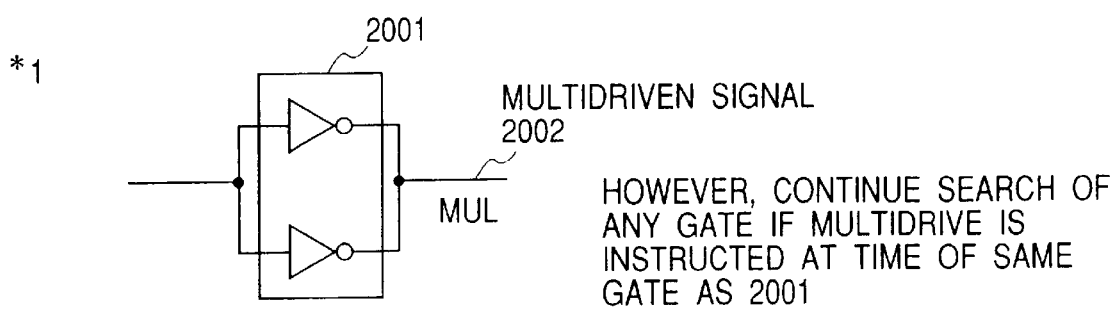

*1  2001 MULTIDRIVEN SIGNAL  2002 MUL

HOWEVER, CONTINUE SEARCH OF ANY GATE IF MULTIDRIVE IS INSTRUCTED AT TIME OF SAME GATE AS 2001

FIG. 12

| SIGNAL TYPE | SEARCH FOR lastFFs | SEARCH FOR CLOCK ASSOCIATED CIRCUITS |
|---|---|---|
| TERMINAL | GO BACK BY ONE GATE AND SEARCH IN ANOTHER DIRECTION | SAME WITH "SEARCH FOR CLOCK ASSOCIATED CIRCUITS" OF FIG.10 |
| FF TERMINAL (INCLUDES TRI-STATE ELEMENTS) | WHEN FF IS SYNCHRONOUS AND FF TERMINAL IS FFout, THIS FF IS lastFF, SEARCH CLOCK ASSOCIATED CIRCUITS FROM FFck<br><br>OTHERS SEARCH IN OTHER FAN-IN DIRECTION | |
| MULTIDRIVED SIGNAL | GO BACK BY ONE GATE AND SEARCH IN ANOTHER DIRECTION | |
| VCC/GND/ FLOATING | THIS SIGNAL IS END POINT GO BACK BY ONE GATE AND SEARCH IN ANOTHER DIRECTION | |

FIG. 13
(a)
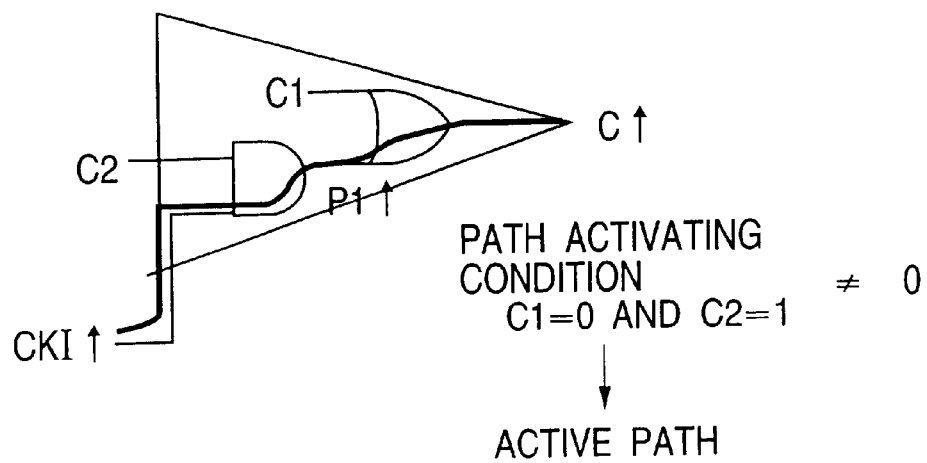
(b)
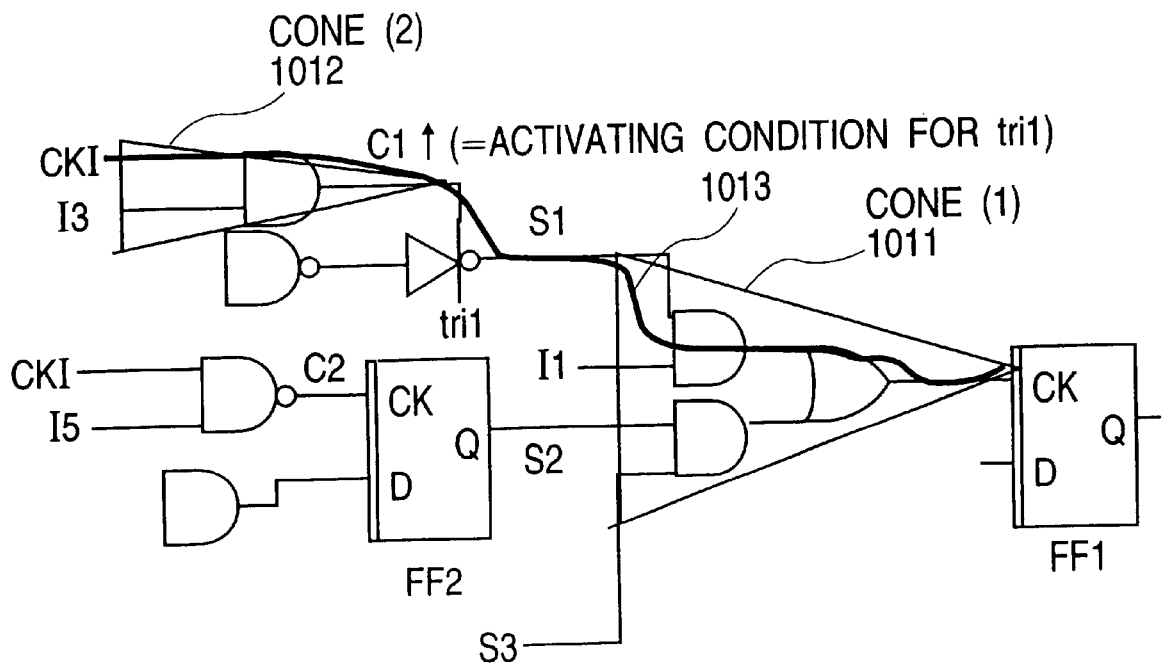

FIG. 14

| PATH DIVIDED BY FF \ WHOLE PATH | CLOCK→OUTPUT | CLOCK→1stFFck | INPUT→1stFF |
|---|---|---|---|
| 1st CONE | (a)PATH (FF1out→OUTPUT) IS ACTIVE ↑ ↓ | (a)PATH (CLOCK→1stFFck) IS ACTIVE<br>(b)PATH (FF2out→1stFFck) IS ACTIVE | DATA→ 1stFFd ↑ ↓ |
| 2nd CONE | (b)PATH (CLOCK→FF1ck) IS ACTIVE<br>(c)PATH (FF2out→FF1ck) IS ACTIVE | (c)PATH (CLOCK→FF2ck) IS ACTIVE | |
| 3rd CONE | (d)PATH (CLOCK→FF1ck) IS ACTIVE | | |
| CONDITION TO DETERMINE ACTIVE PATH | CONDITION (a) AND CONDITION (b)<br>CONDITION (a) AND CONDITION (c) AND CONDITION (d) | CONDITION (a)<br>CONDITION (b) AND CONDITION (c) | ACTIVATING CONDITION OF ABOVE PATH |

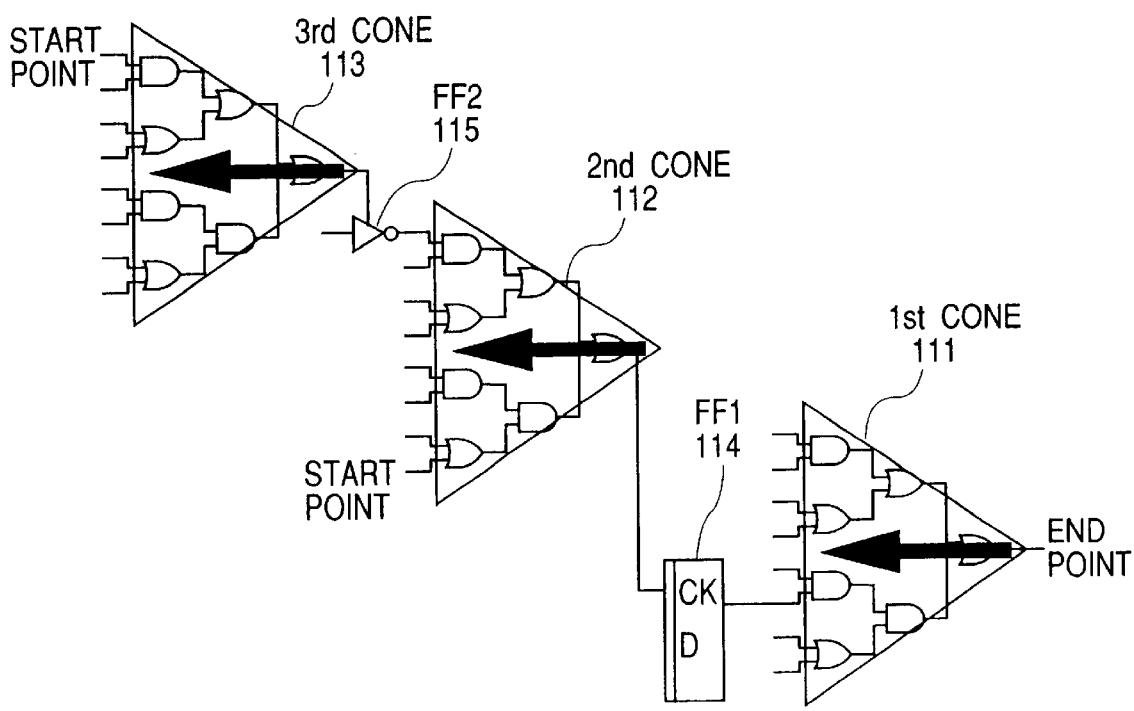

FIG. 15

CLOCK ACTIVATING CONDITION=1st CONE ACTIVATING CONDITION ~121
+ACTIVATING CONDITION IN VIEW OF 2ndFF ~122

1st CONE ACTIVATING CONDITION=1stFF ACTIVATING CONDITION IN
1st CONE WHEN CLK CHANGE

WHEN 1stFFck IS RISING, 1stFF BECOMES ACTIVE
   = CK↑ · ($\overline{h(0)}$ · h(1)) +  CK RISING CONDITION
    CK↓ · ($\overline{h(1)}$ · h(0))  CK FALLING CONDITION WHEN 1stFFck IS FALLING, 1stFF BECOMES ACTIVE
   = CK↑ · (h(0) · $\overline{h(1)}$) +  CK RISING CONDITION
    CK↓ · (h(1) · $\overline{h(0)}$)  CK FALLING CONDITION h(CLK) : CONE HAVING 1stFFck TERMINAL AS
    OUTPUT TERMINAL ACTIVATING CONDITION IN VIEW OF 2ndFF      123

= Σ $_{2ndFF}$ <1> CONDITION THAT 2ndFF IS ACTIVATED
        BY CHANGE OF CLK
    · <2> CONDITION THAT OUTPUT OF 2ndFF
       CHANGES AND 1stFF IS ACTIVATED

<1> WHEN 2ndFFck IS RISING, 2ndFF BECOMES ACTIVE    124
  = CK↑ · ($\overline{g(0)}$ · g(1)) +  CK RISING CONDITION
   CK↓ · ($\overline{g(1)}$ · g(0))  CK FALLING CONDITION WHEN 2ndFFck IS FALLING, 2ndFF BECOMES ACTIVE
  = CK↑ · (g(0) · $\overline{g(1)}$) +  CK RISING CONDITION
   CK↓ · (g(1) · $\overline{g(0)}$)  CK FALLING CONDITION g(CK) : CONE HAVING 2ndFFck TERMINAL AS
  OUTPUT TERMINAL <2> WHEN 1stFFck IS RISING, 1stFF BECOMES ACTIVE    125
  = CK↑ · ($\overline{h(S,0)}$ · h($\overline{S}$,1)) +  CK RISING CONDITION
   CK↓ · ($\overline{h(S,1)}$ · h($\overline{S}$,0))  CK FALLING CONDITION WHEN 1stFFck IS FALLING, 1stFF BECOMES ACTIVE
  = CK↑ · (h(S,0) · $\overline{h(\overline{S},1)}$) +  CK RISING CONDITION
   CK↓ · (h(S,1) · $\overline{h(\overline{S},0)}$)  CK FALLING CONDITION h(S,CK) : CONE HAVING 1stFFck TERMINAL AS
  OUTPUT TERMINAL
  S : OUTPUT OF 2ndFF

FIG. 16

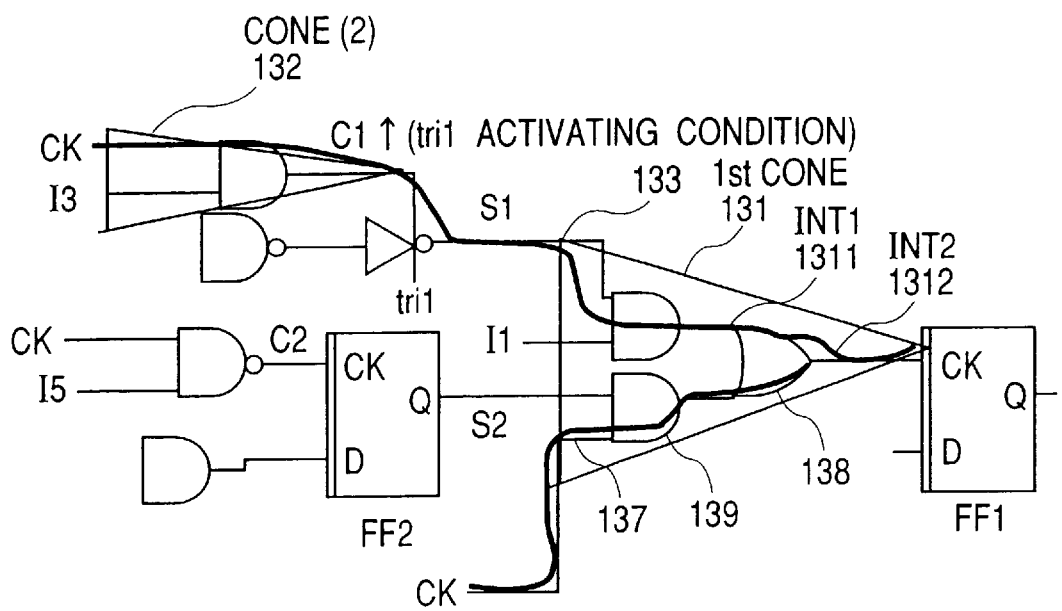

FF1 IS ACTIVATED WHEN FF1ck IS RISING

1st CONE ACTIVATING CONDITION:
EFFECTIVE ONLY WHEN CK IS RISING

| | |
|---|---|
| = | $\overline{h(CK=0)}$ and $h(CK=1)$ = $\overline{(I1 \text{ and } S1)}$ and $(S2 \text{ or } (S1 \text{ and } I1))$ |
| = | $\overline{I1}$ and S1 and S2 |

ACTIVATING CONDITION OF PATHS THROUGH S1 IN VIEW OF 2ndFF
EFFECTIVE ONLY WHEN CK IS RISING

| | |
|---|---|
| = | $\overline{g(CK=0)}$ and $g(CK=1)$ and $\overline{h(S1, CK=0)}$ and $h(S1, \overline{CK}=1)$ |
| = | I3 and $\overline{(S1 \text{ and } I1)}$ and $((S1 \text{ and } I1) \text{ or } S2)$ |

FIG. 17

DATA ACTIVATING CONDITION=1stFF CONE
ACTIVATING CONDITION           ⌐141

⌐142

1stFF CONE ACTIVATING CONDITION=1stFFdat CHANGING
CONDITION WHEN IN CHANGES THROUGH PATHS IN 1stFF CONE =h(IN=0) xor h(IN=1)

h(IN) : CONE HAVING 1st FFdat AS OUTPUT TERMINAL

FIG. 18
(a)
SYSTEM LSI SIMULATION FORM
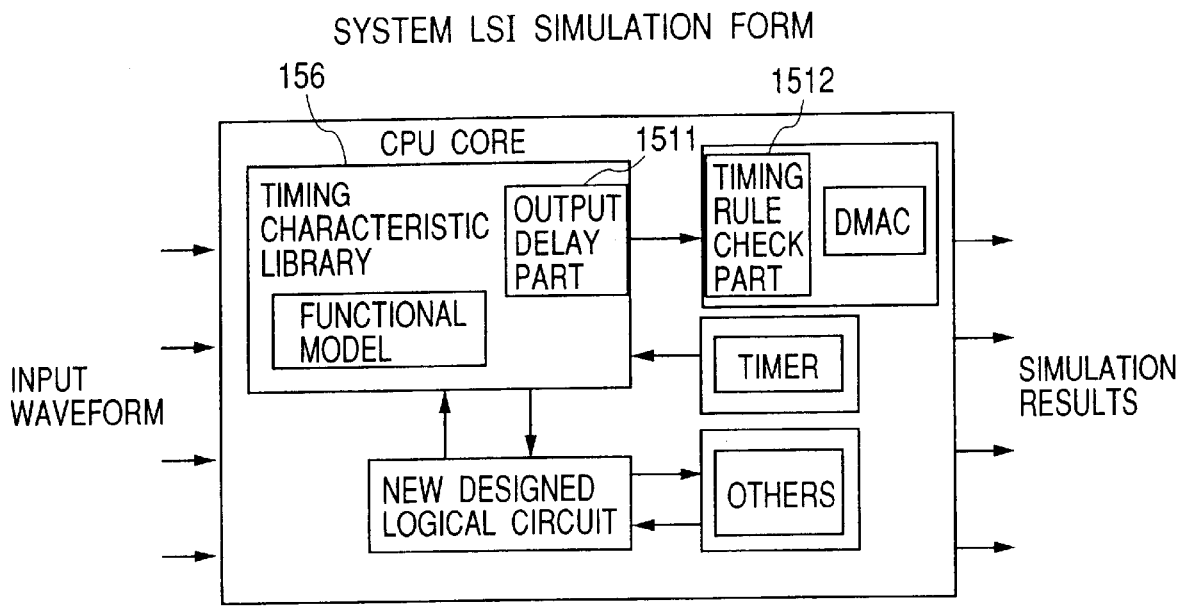
(b)
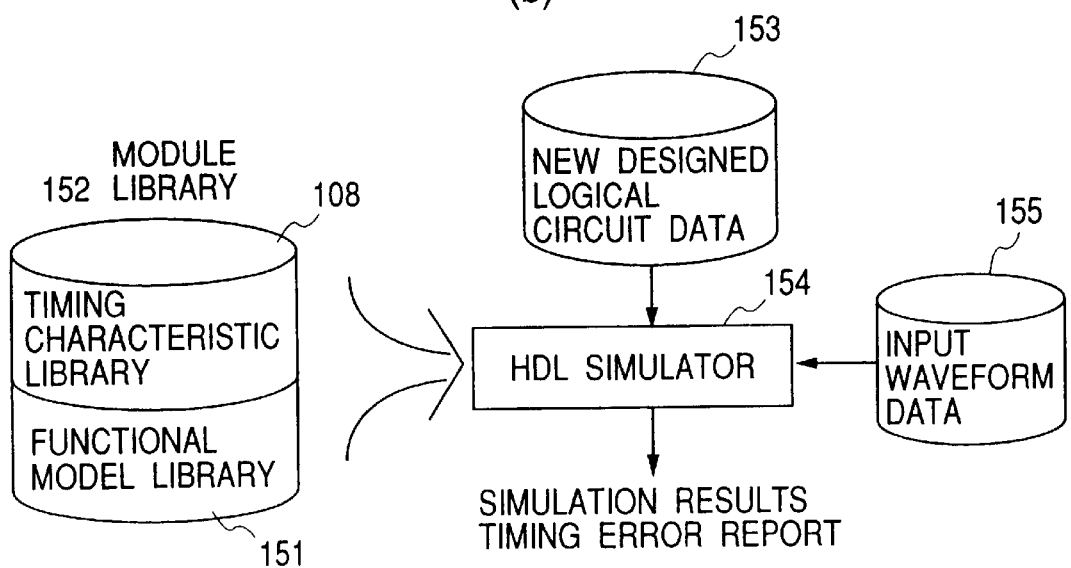

<div>161</div>

<2> WHEN 1stFFck IS RISING, 1stFF BECOMES ACTIVE $$=(\overline{h(S,0)} \cdot h(\overline{S},1)) \cdot (\overline{h(S,1)} \cdot h(\overline{S},0))$$ WHEN CK CHANGES WHEN 1stFFck IS FALLING, 1stFF BECOMES ACTIVE $$=(\overline{h(\overline{S},0)} \cdot h(S,1)) \cdot (\overline{h(\overline{S},1)} \cdot h(S,0))$$ WHEN CK CHANGES h(S,CK): CONE HAVING 1stFFck TERMINAL AS OUTPUT TERMINAL
S: OUTPUT OF 2ndFF (b)

ACTIVATING CONDITION IN VIEW OF 2ndFF OF PATH THROUGH S1: EFFECTIVE ONLY WHEN CK IS RISING          162

= $\overline{g(CK=0)}$ and g(CK=1) and $\overline{h(S1,CK=0)}$ and h($\overline{S1}$,CK=1) and $\overline{h(\overline{S1},CK=1)}$ and h(S1,CK=0)

= I3 and ($\overline{S1}$ and I1 and $\overline{S2}$)

FIG. 24
(a)
DELAY MEASURING PATH DATA
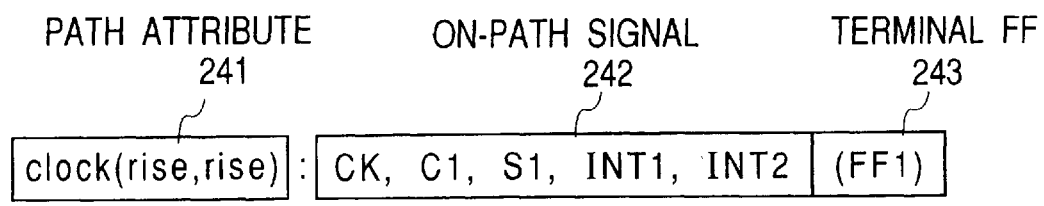
. . .
(b)
ACTIVATING CONDITION DATA
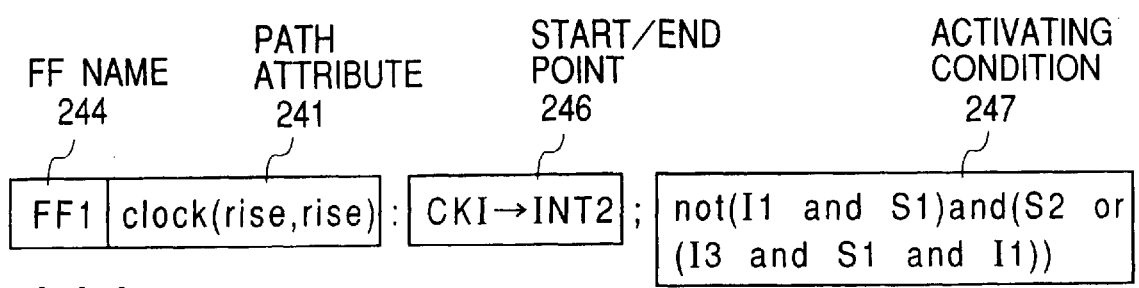
. . .

FIG. 30
(a) EXAMPLE CIRCUITS 3001
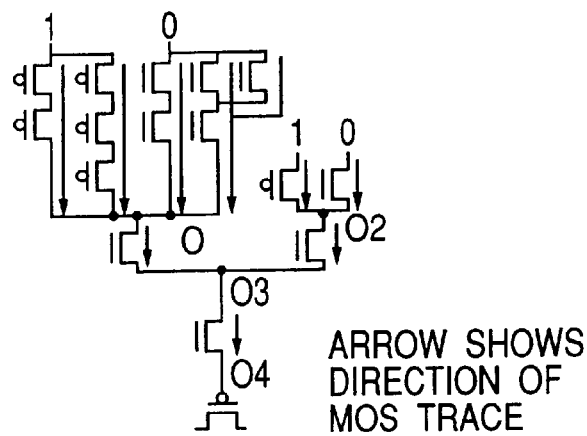
ARROW SHOWS DIRECTION OF MOS TRACE
(b) SEARCH PROCESS OF LOGIC SOURCE AND GATE OUTPUT POINT
| FREQUENCY OF SEARCHES | GATE OUTPUT POINT | LOGIC SOURCE |
|---|---|---|
| INITIAL | O4 | 0, 1 |
| 1 | O4, O, O2 | 0, 1, O, O2 |
| 2 | O4, O, O2, O3 | 0, 1, O, O2, O3 |
(c) GROUP OF GATES WITH SAME OUTPUT FOR EACH GATE OUTPUT POINT
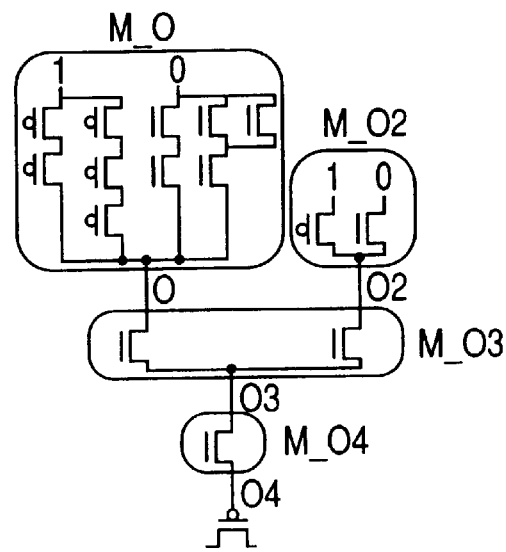

(NOTE) GROUP OF GATES WITH SAME OUTPUT: MOSS TRANSFORMED TO GATES WITH SAME OUTPUT

FIG. 32

(a) GATHERING CONDITION

| NO. | GATHERING CONDITION |
|---|---|
| 1 | WITH DIFFERENT LOGICAL SOURCES MUTUALLY |
| 2 | AND LOGIC OF TRANSFER LOGICS FOR LOGICAL SOURCES IS 0 |

(b) TRANSFER LOGIC

| DISTINCTION | TRANSFER CONDITION FOR LOGICAL SOURCE VALUE | TRANSFER LOGIC |
|---|---|---|
| NMOS CHAIN | g1<br>0<br>I1—∥<br>C1—∥<br>↓<br>O<br>TRANSFER 0 TO OUTPUT O WHEN I1·C1=1 | $I1 \cdot C1$ |
| PMOS CHAIN | v1<br>1<br>I1—∘∥<br>$\overline{C1}$—∘∥<br>↓<br>O<br>TRANSFER 1 TO OUTPUT O WHEN $\overline{I1} \cdot C1$=1 | $\overline{I1} \cdot C1$ |

FIG. 33
(a) REPRESENTATION BY TRI-STATE ELEMENT
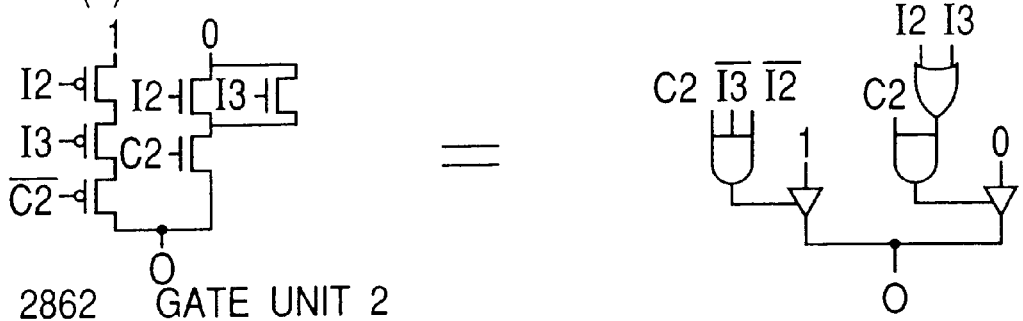
2862 GATE UNIT 2
(b) GATHERING RULE OF TRI-STATE ELEMENTS
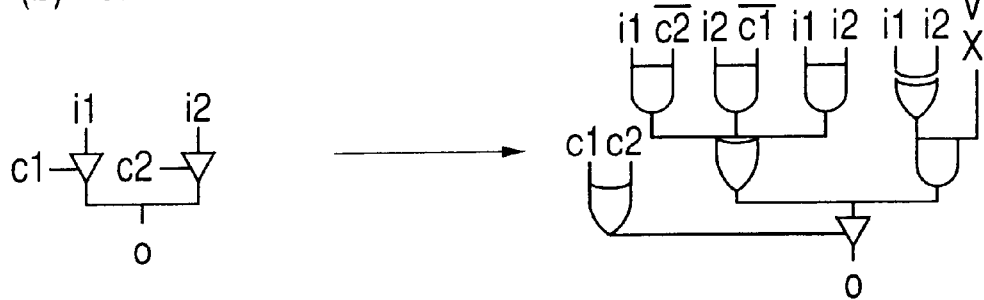
(c) GATHERING OF TRI-STATE ELEMENTS
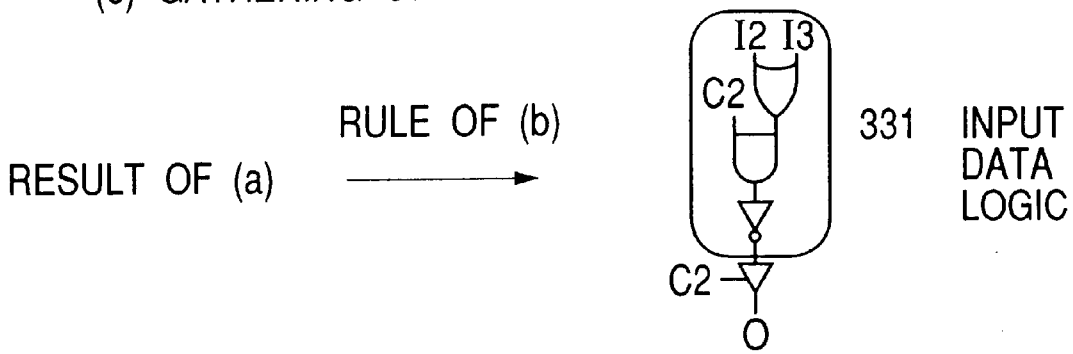
RESULT OF (a) —RULE OF (b)→ 331 INPUT DATA LOGIC
(d) DIVISION OF INPUT DATA LOGIC BY CONTROL
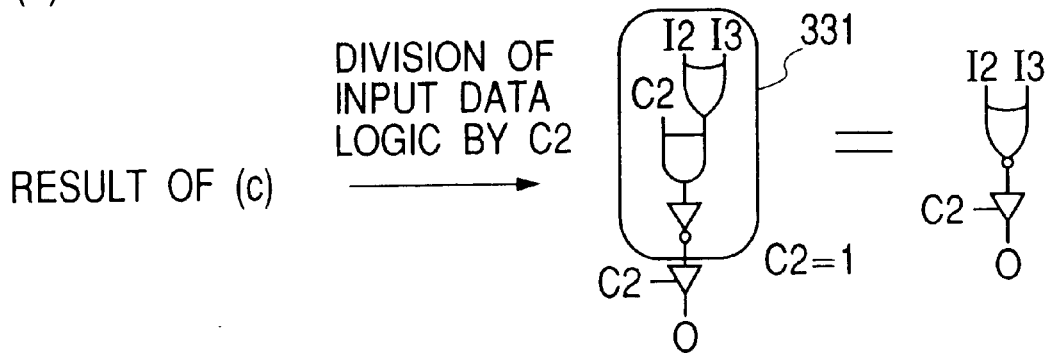
RESULT OF (c) —DIVISION OF INPUT DATA LOGIC BY C2→

FIG. 34
(a)
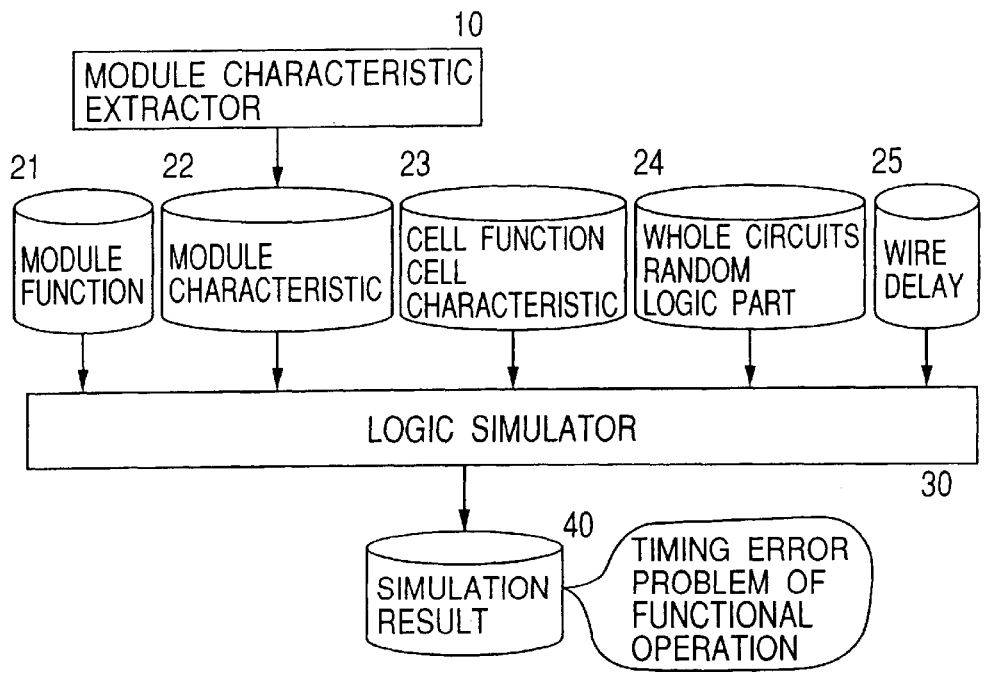
(b)
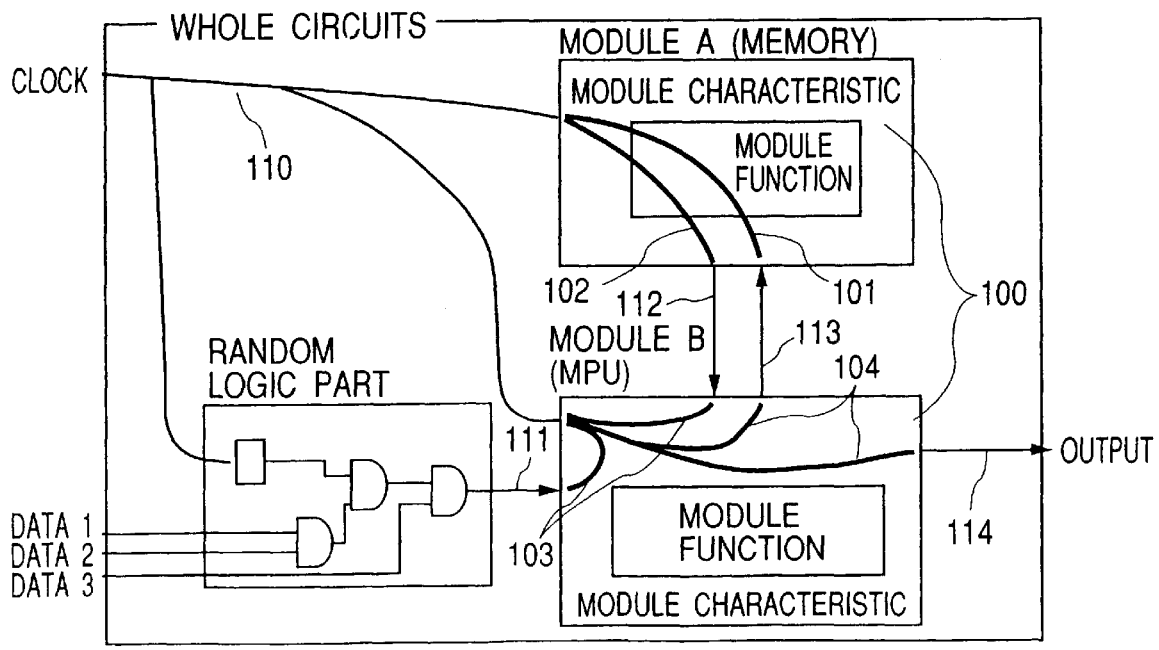

METHOD OF EXTRACTING TIMING CHARACTERISTICS OF TRANSISTOR CIRCUITS, STORAGE MEDIUM STORING TIMING CHARACTERISTIC LIBRARY, LSI DESIGNING METHOD, AND GATE EXTRACTION METHOD

TECHNICAL FIELD

The present invention relates to a method of extracting timing characteristics from transistor circuit data in modularity design products of a CPU core and others and extracted timing characteristics are used for timing constraints when the timing verification of a circuit including an extracted module, logic synthesis or timing-driven layout is performed. Particularly, as the condition fit for a timing rule of a module is included in timing characteristics when timing verification is performed by simulation, verification free of a pseudo error is enabled. The present invention also relates to the structure of a timing characteristic library, a storage medium storing it and an LSI designing method using it.

BACKGROUND ART

The age of a large-scale one-chip system is coming and it is being essential to provide system LSI utilizing already designed data in a short term so as to enhance the competitive strength of a chip and a system. Particularly recently, design products or the design of system LSI utilizing intellectual properties (IP) rapidly increases. For example, in the design of an application specific integrated circuit (ASIC) reusing modularity design products of a CPU core and others, the manufacturer of ASIC provides a module to a client such as a system house and the client designs adds a logic proper to the client to the module and designs ASIC. At this time, it is not enough to provide only the description of a logical function to the client. Because the timing verification of the whole chip is required to be executed. In this case, a CPU core viewed from the side of a client is a black box and the timing verification of the whole chip is impossible without timing characteristics in an interface of a CPU core. To provide timing characteristics to a client, characteristics are required to be extracted from a module, however, heretofore, extraction work depended upon manual labor. Therefore, considerable man-hours were required and simultaneously, there was always fear that an error might be included in a timing extraction result.

Then, the object of the present invention is to extract timing characteristics from the layout data of a module. As for the present invention, for a method of extracting timing characteristics, a method of extracting timing characteristics every cell and utilizing the result of the extraction was also examined.

For a method using prior art, there is Japanese published unexamined patent application No. Hei 4-316166 disclosing a timing characteristics extracting tool at a cell level and others. In these methods, the data of a transistor circuit is input, the simulation of the whole circuit is automatically executed and timing characteristics are extracted, however, as the scale of a dealt circuit is a level of a cell, a circuit composed of approximately a few hundred transistors is dealt and a large-scale transistor circuit of a few MB cannot be dealt. Difference between a large-scale transistor circuit and a circuit at a cell level will be described below.

(1) At a cell level, it may be also thought that a cell of a sequential circuit is equivalent to a bistable circuit (a flip-flop (FF)) and the effect of another circuit between the terminal of a cell and a bistable circuit is not required to be considered. A case that plural bistable circuits have an effect upon timing is also not required to be considered.

(2) At a cell level, as a circuit is composed of a few hundred transistors, timing characteristics can be extracted even if the whole circuit is simulated. In the meantime, to extract the timing characteristics of the whole large-scale circuit in simulation, considerable processing time is required.

(3) At a cell level, the extraction of the timing characteristics of a complicated circuit acquired by combining bistable circuits is not a target. A large-scale circuit includes a complicated sequential circuit such as a divided clock generating circuit and such a circuit is also required to be dealt.

In the present invention, a method of realizing the extraction of timing characteristics of a large-scale circuit is provided in view of the above difference.

As in prior art, a method of extracting timing characteristics at the level of a small-scale cell is dealt, the prior art itself cannot be applied to a large-scale circuit as described in above (1) to (3). There are the following three objects in relation to dealing a large-scale transistor circuit.

(1) To provide a method of modeling and processing the definition of timing characteristics at a terminal even if plural bistable circuits are included in addition to a circuit except a bistable circuit.

(2) To provide a method of modeling and processing timing characteristics the processing time of which is in a range of actual use even if a transistor circuit of a few MB is dealt.

(3) To provide a method of dealing in case a complicated circuit is included.

DISCLOSURE OF INVENTION

Means to achieve the above three objects will be described below.

First, a modeling method to achieve the objects (1) and (2) will be described and next, a processing method will be described.

(1) Modeling Method

The target of a module is a synchronized circuit shown in FIG. 3. For timing characteristics, there are two types of delay of output and a timing rule of input (setup time/hold time). As a target circuit is a synchronized circuit, timing is based upon a clock. That is, output delay means delay of output based upon time when a clock varies and a timing rule means is a generic term of constraints on the setup time or the hold time of input in relation to a clock.

The timing and a circuit that determines timing of a synchronized circuit are as follows.

In the case of output delay, as shown in FIG. 3, the last bistable circuit (FF) 35 finally having an effect upon output functions as a basic circuit that determines timing. That is, time until the last bistable circuit 35 is activated according to a clock 311 and the change of the output of the bistable circuit is propagated to output 313 is output delay. Therefore, associated circuits are circuits on a path from a clock to output via the last bistable circuit. As plural paths may exist as to the above path, the delay value of a path having the maximum delay value that has the worst effect upon other circuits is output delay in consideration of all circuits on these paths.

In the case of a timing rule, as shown in FIG. 3, a first bistable circuit 34 which input 312 first reaches is a basic circuit that determines timing. That is, if input is unstable since before the setup time of time when a clock varies until after a hold time, the output of the first bistable circuit varies and desired output cannot be acquired. In this modeling method, the above timing rule (setup time and hold time) is not directly acquired including a bistable circuit but is acquired by adding or subtracting the skew of delay from a clock to a bistable circuit ck 32 and delay from input to a bistable circuit d 33 to/from a timing parameter of a bistable circuit. FIG. 4 shows the above calculating method. Further, other circuits forms a long path between a bistable circuit and an input/clock terminal and even if a clock and input vary at a terminal, the variation is not always propagated to a bistable circuit. Therefore, as shown in FIG. 4, a rule is checked by inputting a condition fit for the rule to a timing rule and testing whether variation is propagated or not. Unless the above test is performed, a signal used in another circuit is also checked in verification by simulation shown in FIG. 18 and a pseudo error frequently occurs.

Based upon the above modeled timing rule, if plural first bistable circuits exist, the maximum value of the timing parameters of the plural first bistable circuits is adopted as shown in FIG. 4 and the conditions fit for the rule of all the first bistable circuits are ORed.

(2) Processing Method

To acquire a model described in above (1), a method shown in FIG. 1 is adopted.

First, transistor circuit data 102 is input and a gate and a bistable circuit are reconstructed in a step 11. Afterward, a first bistable circuit and a last bistable circuit which the above data respectively first reaches from an input terminal and an output terminal are searched and circuits from each terminal to each bistable circuit are recognized as associated circuits in a step 12.

As described in the problem (2), as it takes much processing time to measure delay in the simulation of the whole large-scale transistor circuit, an effective path from each bistable circuit to input/output is searched and a path 104 the delay of which is to be measured is input to a high-speed static delay measuring tool in a step 13. Hereby, as a path which is logically impossible is prevented from being included in paths the delay of which are measured in the static delay measuring tool, the above step is necessary. Simultaneously, a condition (an activating condition 105) for input/a clock to propagate change to the first bistable circuit is generated in a step 14. A timing characteristic library 108 is generated based upon the delay 106 measured in measuring delay 15, the activating condition 104 and the bistable timing rule 107 according to the modeling method acquired in above (1) in a step 16.

For means for solving the problem described in the problem (3), there are the recognizing method in the step 12 and the method of generating an activating condition in the step 14. The main problem is how to deal a divided clock generating circuit and an element except a combinational circuit. The above main problem will be described in best embodiments for embodying the present invention in detail.

BRIEF DESCRIPTION OF THE DRAWINGS

FIG. 5 show transistor circuit information and auxiliary information,

FIG. 6 shows the configuration of a timing characteristic library,

FIG. 14 shows the search 2 of a delay measuring path, FIG. 15 shows a clock activating condition, FIG. 16 shows an example of the calculation of the clock activating condition, FIG. 17 shows a data activating condition, FIG. 18 show a form in which the timing characteristic library is used, FIG. 19 show another method of generating a clock activating condition, FIG. 30 shows a method of dividing into a group of gates with the same output in a step 283, FIG. 32 shows a condition for gathering to be a pair of chains when the processing of a step 3021 is executed, FIG. 33 show a gate transformation processing method in a step 285 and FIG. 34 shows the simulation of the whole system using module characteristics.

BEST MODE FOR CARRYING OUT THE INVENTION

Figure 1:
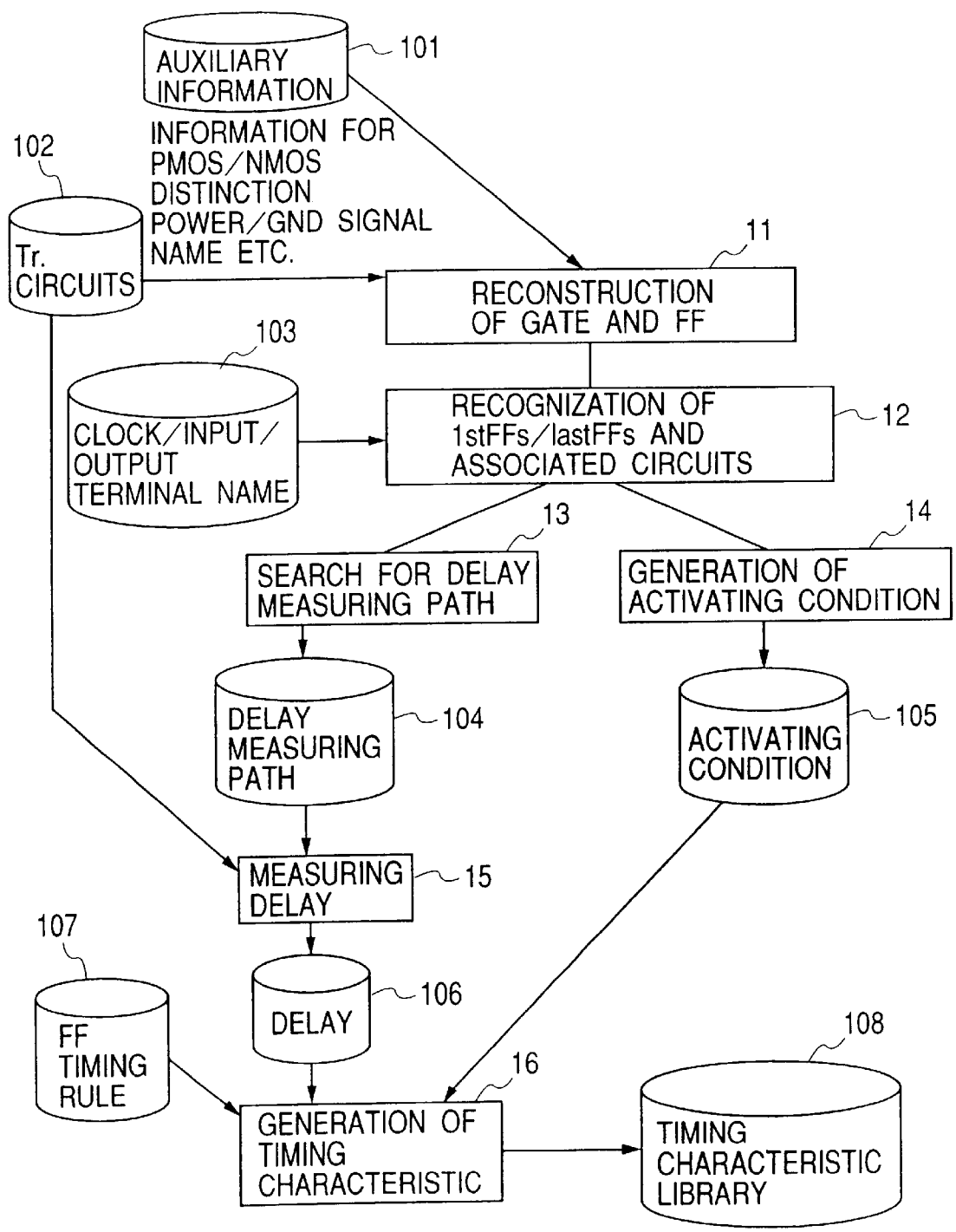
FIG. 1 is a flowchart showing a timing characteristic extracting method.

Referring to the drawings, embodiments of the present invention will be described in detail below.

1. Processor in which the Present Invention Is Operated

Figure 2:
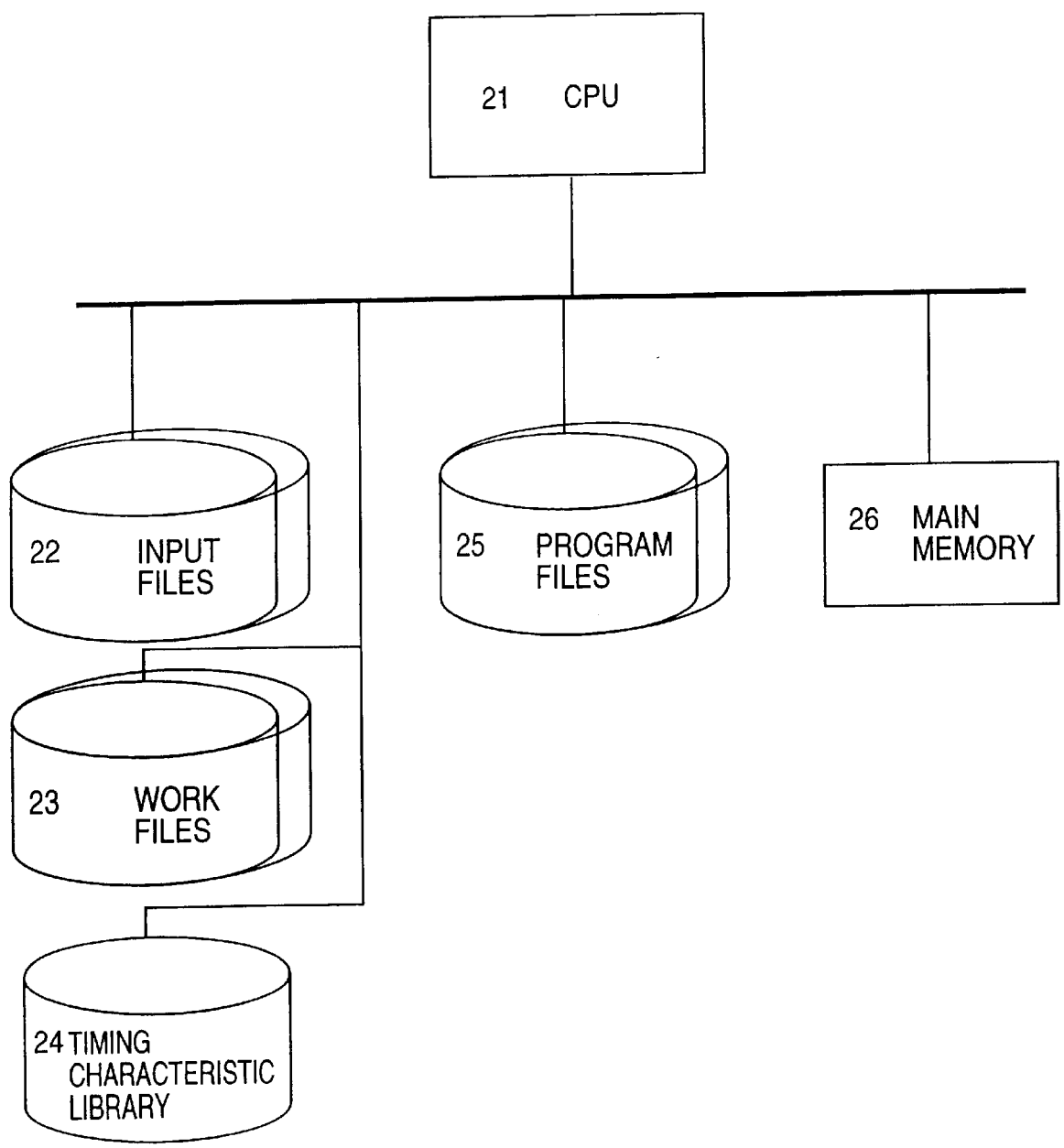
FIG. 2 shows a processor in which the present invention is operated.

The present invention is operated in a processor shown in FIG. 2. In the present invention, transistor circuits (layout data at the level of a transistor) 102, auxiliary information (information for distinction between PMOS and NMOS, a power/GND signal name and others) 101, an input/output terminal name 103 and a bistable circuit timing rule 107 respectively shown in FIG. 1 are stored as input files 22, programs for realizing processing in steps 11 to 16 shown in FIG. 1 are stored as program files 25, the processing of these programs is executed by CPU 21 and a timing characteristic library 24 is output. When processing is executed by CPU 21, first, a program of program files 25 is input to a main memory 26 and is executed. A program in each processing step inputs and outputs a temporary result to/from the main memory 26 and finally, outputs a program execution result into a file. A program in steps 13, 14 and 15 outputs temporary files 104, 105 and 106 which function as input to the program in the next step as work files 23.

2. Timing Characteristic Modeling Method

Figure 3:
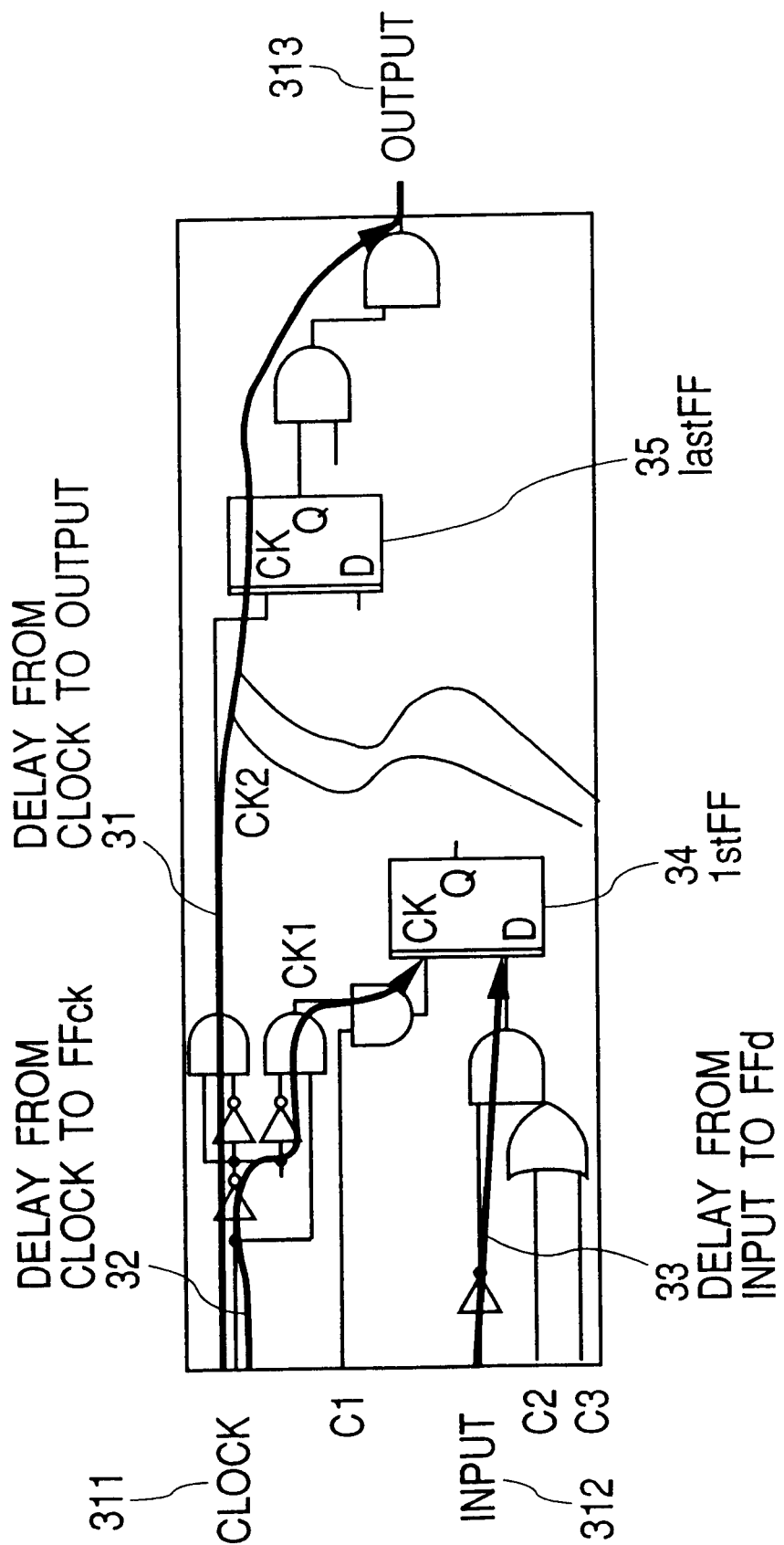
FIG. 3 shows an example of circuits.
Figure 4:
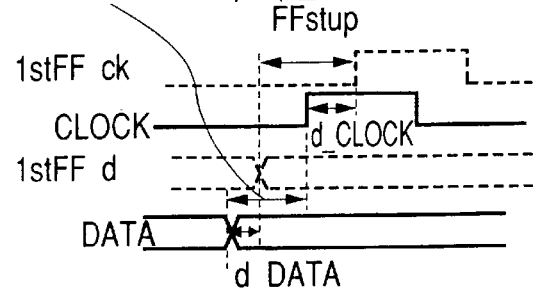
FIG. 4 shows a method of modeling timing characteristics.

Referring to FIGS. 3 and 4, a timing characteristic modeling method upon which a timing characteristic extracting method is based will be described below before the timing characteristic extracting method is described.

Output delay means delay 31 from a clock 311 to output 313 through a last bistable circuit 35 as described in the item of the disclosure of the invention. If plural paths exist because of paths between the last bistable circuit 35 and a gate circuit on the above path, the delay of a path having the maximum value is used for output delay. The above reason is that delay in timing verification on the above path having the maximum value when another circuit is connected to the above circuit is the worst.

A timing rule is composed of a setup time rule and a hold time rule and each is composed of a timing parameter which is time constrained by a clock for determining timing and a condition fit for the rule for determining whether a rule is adaptable at a terminal or not.

A timing parameter is a value acquired by converting the timing rule of a bistable circuit 1st FF (one type of a sequential circuit element) which input first reaches to time when a module is input as shown in FIG. 3. That is, a timing parameter is a value acquired by correcting clock delay (delay from a clock to the clock terminal CK of the first bistable circuit 1st FF) d_clock (32 in FIG. 3) and input delay (delay from input 312 to the data terminal D of the first bistable 1st FF) d_data (33 in FIG. 3). FIG. 4 shows relationship between a timing rule of input and a timing rule of a bistable circuit using setup time as an example.

As clear from a timing chart shown in FIG. 4, more concretely, setup time is expressed in the following expression.

Setup time of input=setup time FFstup of 1st FF+(input delay− clock delay)  expression 1

Similarly, hold time is expressed in the following expression.

Hold time of input=hold time FFhold of 1st FF−(input delay− clock delay)  expression 2

If plural paths having delay and plural first bistable circuits exist, the maximum value of values acquired in the expressions 1 and 2 is adopted.

The condition fit for the rule is a condition of whether the following change is propagated to a first bistable circuit 1st FF or not when a clock and data change and unless this condition is made, a rule check is made by mistake in case input is applied to another circuit except a target circuit.

The condition fit for the rule is determined by a gate circuit from a clock/input to the first bistable circuit 1st FF. That is, the condition fit for the rule is acquired by AND operation of a data activating condition and a clock activating condition. The data activating condition is a condition that the change of data is propagated to the first bistable circuit 1st FF and the clock activating condition is a condition that the change of a clock is propagated to the first bistable circuit 1st FF and the clock terminal of the first bistable circuit 1st FF functions as the criterion (rise or fall) of a timing rule of a bistable circuit. For example, in the example of the circuit shown in FIG. 3, its data activating condition is that C2 or C3=1 and its clock activating condition is that a clock is in a leading edge and C1=1 if the timing criterion of a bistable circuit is set to rise. A method of acquiring an activating condition will be described in detail below.

3. Timing Characteristic Extracting Method

FIG. 1 shows a timing characteristic extracting method described below according to the present invention.

In the timing characteristic extracting method, the transistor circuit data 102, the auxiliary information 101 composed of the distinction between PMOS transistor and NMOS transistor, a power/ground (GND) signal name in a transistor circuit and others, the information of an input/output terminal of a clock and timing characteristics 103 and the timing rule 107 of bistable circuits in the transistor circuit are input and the timing characteristic library 108 is output.

The above method is composed of a step 11 in which a gate and a bistable circuit are reconstructed based upon the transistor circuit data 102 and the auxiliary information 101, a step 12 in which the respective associated circuits of the first bistable circuit 1st FF and the last bistable circuit last FF are recognized based upon the reconstructed gate and bistable circuit, a step 13 in which a delay measuring path is searched out of the associated circuits and is output to the delay measuring path file 104, a step 14 in which an activating condition is generated based upon the associated circuits and is output to the activating condition file 105, a step 15 in which delay required for timing characteristics is measured based upon the transistor circuit data 102 and the delay measuring path file 104 and is output to a delay file 106 and a step 16 in which the timing characteristic library 108 is output based upon the measured delay, the activating condition 105 and the bistable circuit timing rule 107 according to the above modeling method.

First, input/output 102, 101, 103, 107 and 108 will be described below and next, each processing step will be described in detail.

3.1 Input/output

FIG. 5(a) shows the input transistor circuit data 102 and auxiliary information 101 and FIG. 5(b) is a schematic drawing showing the transistor circuit.

In the example of the transistor circuit, an NMOS transistor 4021 and a PMOS transistor 4011 are combined and are two transistors the subcircuit name 41 of which is EXSMPL, which have terminal names shown as 42 and the element names 43 of which are MXX1 and MXX2. A drain 44, a gate 45 and a source 46 are respectively connected to a signal line shown in the drawing and the respective element models 47 are penh and nenh. In the auxiliary information, it is provided as information that the element model of "penh" is the PMOS transistor, the element model of "nenh" is the NMOS transistor, VDD1 is power signal name and GND1 is GND signal name. Therefore, a circuit diagram shown in FIG. 5(b) is represented. A gate can be reconstructed from the transistor circuit based upon the above information in the step 11 shown in FIG. 1.

In the auxiliary information, information for searching associate circuits 40 is also included and will be described later in relation to the processing in the step 12.

Another input information, the input/output terminal name 103 is information showing the names of the input/output terminals to/from which a clock and extracted timing characteristics are input or output and the bistable circuit timing rule 107 is the timing parameter of a bistable circuit in the transistor circuit. The necessity of the above information is described in the above item 2.

FIG. 6 shows the timing characteristic library which is output. In this example, the contents of the library and a method of utilizing the library are described in a type of hardware description language. The contents of a timing characteristic library part 54 are generated as a library. In this example, they are inserted into each item of a time scale 51 showing unit time and precision, an interface 52 and calling a functional model in a lower-level hierarchy 53 and are used. That is, the contents of the timing characteristic library are used as a model for timing verification together with a functional model by adding timing characteristics to an upper-level hierarchy of the functional mode of the circuit.

Figure 27:
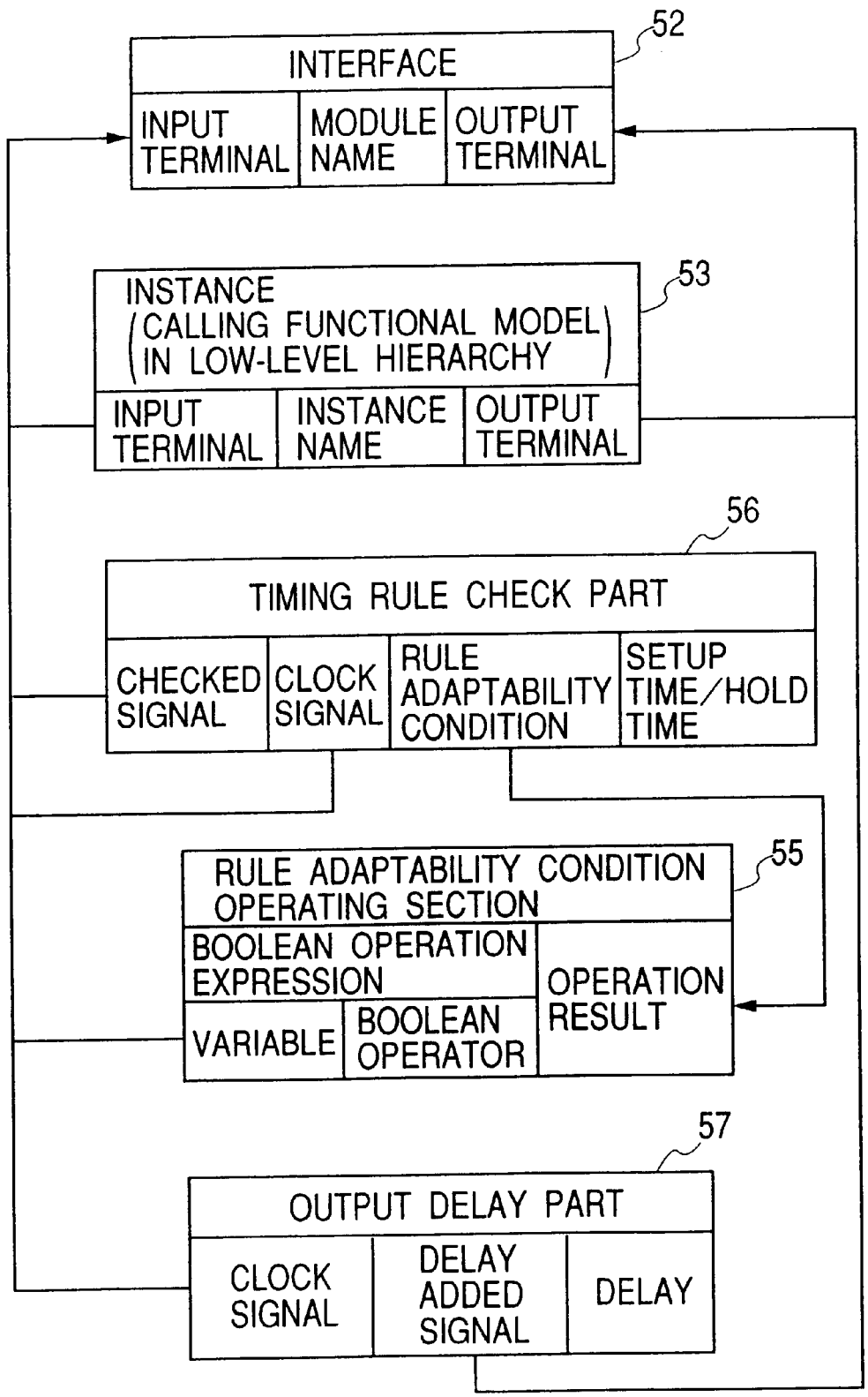
FIG. 27 shows the data configuration of the timing characteristic library.

The data configuration of the timing characteristic library is composed of the interface 52, an instance (calling a functional mode in the lower-level hierarchy) 53, a timing rule check part 56, logic elements for a condition fit for the rule 55 and an output delay part 57 as shown in FIG. 27.

The interface 52 is composed of a module name, an input terminal name and an output terminal name as shown in FIG. 27. In FIG. 6, ADCH8S2 is equivalent to a module name, CKM input to which is declared and others are equivalent to an input terminal name and LFDIN output from which is declared and others are equivalent to an output terminal name.

The instance 53 is a part for calling a functional model as the lower-level hierarchy of this library and as shown in FIG. 27, is mainly composed of an instance name, an input terminal name and an output terminal name. In FIG. 6, ADCH8S2_core is equivalent to an instance name and a signal name in the parenthesis of CKM (CKM) is equivalent to an input terminal name or an output terminal name. CKM is a signal of this library which is the upper-level hierarchy and CKM in an upper-level hierarchy is connected to a terminal of a functional model in the parenthesis by the above description. This shows that a terminal name in the instance refers to a signal in the upper-level hierarchy in data configuration and in FIG. 27, being referred is shown by an arrow directed to the interface.

The timing rule check part 56 is a part for checking the timing of setup time and hold time. As shown in FIG. 27, a checked signal, a clock signal and a condition fit for the rule and setup time (hold time) are main components.

In FIG. 6, in $setup describing a setup time check, PDB8 denotes a checked signal, CKM denotes a clock signal, C_C_1 denotes a condition fit for the rule and 1.572000 denotes setup time. The above description means that it is checked whether the setup time of PDB8 is 1.57 ns or less (unit is ns by a time scale statement shown as 51) based upon the rise of CKM (negedge syntax) when C_C_1 is 1 or not.

For data configuration, as shown by the arrow in FIG. 27, a checked signal and a clock signal refer to the input terminal of an interface signal and a rule adaptation condition refers to the result of operation by logic elements for the condition fit for the rule 55.

The logic elements for the condition fit for the rule 55 are composed of Boolean operation expression having a variable and Boolean operator and the result of operation as shown in FIG. 27. In FIG. 6, one line starting by "and" shows Boolean operation expression of ADCH0 and PDB8, ADCH0 and PDB8 denote a variable and "and" denotes Boolean operator. C_C_1 denotes the result of operation. For data configuration, as shown by the arrow in FIG. 27, a variable refers to an input terminal name in the interface 52 and a condition fit for the rule in the timing rule check part 56 refers to the result of operation.

Finally, the output delay part 57 is mainly composed of a clock signal, a delay added signal and delay as shown in FIG. 27. In FIG. 6, CKM denotes a clock signal, LFADIN denotes a delay added signal and (1.302, 1.590) denotes delay. The above description shows that LFADIN is output with the rise delay of 1.302 ns and the fall delay of 1.590 ns after CKM varies. The unit ns of delay is specified in the time scale 51.

FIG. 24 shows components of the delay measuring path data 104 which is temporary output. This example is the data representation of a path from CK passing tri1 shown in FIG. 13 to FF1. The above delay measuring path data is composed of three data of a clock path from a clock to 1st FF, a data path from input data to 1st FF or a path attribute 241 showing distinction from a clock to output, gates from a starting point to an end point or on-path signals 242 including signal names output from sequential circuit elements and a terminal bistable circuit FF 243 showing the name of a bistable circuit at a terminal.

FIG. 24 shows components of the activating condition 105 which is temporary output. The above example is the data representation of an activating condition of a clock CK for a bistable circuit FF1 shown in FIG. 13. The above activating condition is composed of four data of a bistable name 244, a path attribute 241 having the same representation as delay output path data, a starting/end point 246 and an activating condition 247 showing Boolean representation using a signal name as a variable.

A method of generating the timing characteristic library part 54 is the principal object of this embodiment and the details will be described in the following 3.2.

3.2 Each Processing Step of the Timing Characteristic Extracting Method

Each processing step shown in FIG. 1 will be described below.

3.2.1 Step 11: Reconstruction of Gate and a Bistable Circuit

This step is composed of the reconstruction of a gate for reconstructing a gate circuit out of transistor circuits and the reconstruction of a bistable circuit for reconstructing a bistable circuit based upon the reconstructed gate circuit. The automation of extracting timing characteristics can be realized by acquiring timing measured locations and activating conditions. It is difficult to acquire the above both from the layout data at a transistor level and it is necessary to once extract (reconstruct) a gate and a bistable circuit. Of the above extracting (reconstructing) processing, as the extraction (reconstruction) of a bistable circuit is processed using the result of the extraction (reconstruction) of a gate, the extraction (reconstruction) of the gate is a premise of all processing.

3.2.1.1 Reconstructing a Gate

Figure 7:
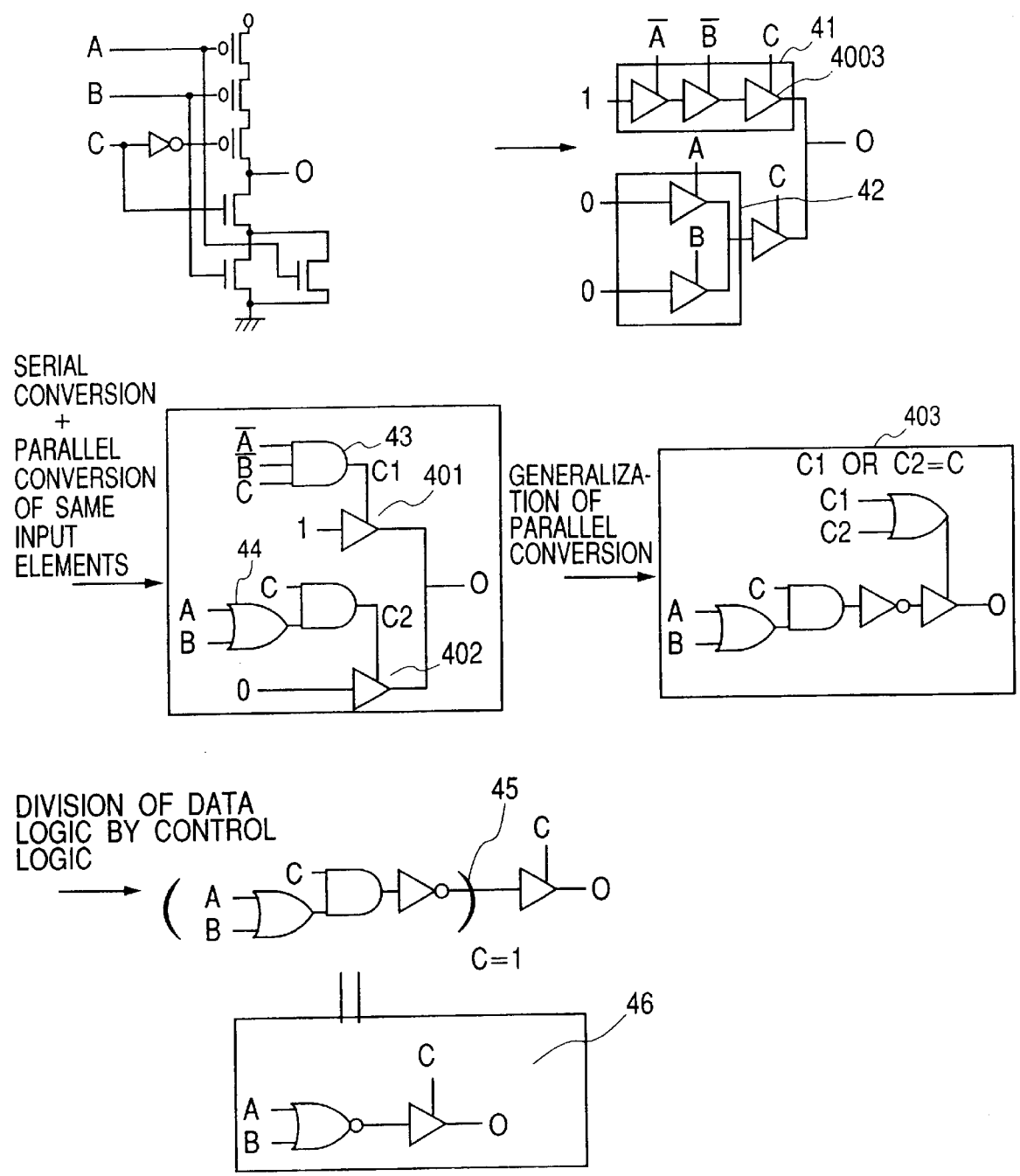
FIG. 7 shows an example 1 in which a gate and a bistable circuit are reconstructed 11 and the reconstruction of a gate, FIG. 8 show an example 2 in which a gate and a bistable circuit are reconstructed 11 and the reconstruction of a bistable circuit.

For a method of extracting (reconstructing) a gate circuit out of MOS transistor circuits, there are heretofore various well-known examples for the support of layout data verification, the speedup of the logic simulation of a transistor circuit and format verification. Out of them, for an example by these inventors also dealing a tri-state gate (a gate having a tri-state condition in output and one type of a sequential circuit element), a process disclosed in Japanese published unexamined patent application No. Hei 9-179885 will be briefly described referring to FIG. 7. First, an individual transistor of transistor circuits shown in FIG. 7 is transformed into a virtual tri-state element 4003. Next, when processes for transforming the serially connected tri-state elements 41 into one tri-state element 401 having AND 43 of the control logic of each tri-state element as control logic and for transforming parallel connected elements 42 with the same input into a tri-state element having OR 44 of each control logic as control logic are repeated, a circuit 402 is generated. Third, a circuit 403 is acquired by generalizing parallel connected tri-state elements with different input such as parallel conversion. The details of the above process are omitted, however, in this example, the above parallel connected tri-state elements with different input can be transformed into one tri-state element having the inverted logic of input to the circuit 402 as input and having OR of the control logic C1 and C2 of the circuits 401 and 402 as control logic. Finally, considering that the above input has an effect upon output only when the control logic C1 or C2=C is 1, input logic is divided by control logic and contracted gate logic shown as 46 is acquired.

The above method is a method of extracting a gate from layout data and when MOS transistors composing one gate are determined, a gate is extracted based upon only switching characteristics without depending upon the configuration of the connection of MOS transistors. However, a method of dividing gates with the same output into a gate unit is not shown.

The method peculiar to the present invention of dividing gates with the same output into a gate component without depending upon the configuration of the connection of MOS transistors will be disclosed below. First, the policy of division will be described and next, a method of division will be described.

(1) Policy of Division

Division is executed using a condition which a gate has (hereinafter called a gate condition) that both 0 and 1 can be output, however, 0 and 1 are not simultaneously output.

For division into a gate group with the same output, first, an output point of a gate of MOS transistors is determined using a first gate condition that both 0 and 1 can be output. Next, MOS transistors are divided regarding an area from a logical source to output from each gate as a gate group with the same output.

A gate group with the same output is divided into a gate unit by separating a gate group with the same output into a basic unit based upon which a logical value of output from a gate is determined, afterward collecting as many basic unit groups which meet a gate condition as possible and generating a gate unit.

(2) Method of Division (a) Division into a Gate Group with the Same Output

In this processing, a set of a gate output point and a logical source is determined and next, MOS transistors are divided into a gate group with the same output.

The set of a gate output point and a logical source is determined by the following processing.

First, an initial value of the set is set. As a connection to the gate terminal of a MOS transistor (hereinafter called only a gate terminal) is a point from which a logical value is propagated to another basic unit for gate extraction independent of a gate condition, the above connection is set as an initial value of a gate output point. As a power is logically a source of 1 and ground is a source of 0, these are set as an initial value of a logical source.

Next, a gate output point and a logical source are searched. If a path along an effective direction of MOS transistors is defined as MOS transistor trace path, a point at which MOS transistor trace paths from plural different logical sources cross can be a gate output point which meets the first gate condition. Therefore, in processing for a search, a point at which MOS transistor trace paths from plural different logical sources first cross is set to a new gate output point. As the above cross-point can be a new logical source, it is added to both sets of gate output points and logical sources. The sets of a gate output and a logical source are acquired by repeating the above processing for a search until no new gate output point is left.

MOS transistors are divided into a gate group with the same output by setting a logical source immediately before each of the acquired gate output points on a MOS transistor trace path to the gate output point and MOS transistors surrounded by the gate output point as a gate group with the same output.

(b) Division of a Gate Group with the Same Output

The above processing is executed according to a procedure that a gate group with the same output is separated into a basic unit that determines a logical value of output from a gate and the basic unit is sequentially gathered so that it becomes a gate transformation unit.

The basic unit that determines a logical value of output from a gate is a MOS transistor group on one MOS transistor trace path from each logical source in a gate group with the same output to a gate output point and the MOS transistor group is called a MOS transistor chain. Therefore, in a first step, a gate group with the same output is separated into a MOS transistor chain.

MOS transistor chains are gathered to be a gate unit by first gathering two MOS transistor chains to be a pair of chains and gathering pairs of chains.

Gathering to be a pair of chains is processed as follows.

Two MOS transistor chains with different logical sources (hereinafter called partner chains 1 and 2) are gathered to be a pair of chains to meet the first gate condition that both 0 and 1 are output. However, to meet a second gate condition that 0 and 1 are not simultaneously output, constraint that a condition for transferring a logical value from a logical source to a gate output point does not simultaneously come into effect is applied to gathered MOS transistor chains.

The gathering of pairs of chains means processing for generating the maximum MOS transistor group to be which pairs of chains are gathered to meet a gate condition. In the above processing, processing for gathering that the acquired pairs of chains are gathered and the gathered group of pairs of chains is redefined as a new pair of chains is repeated until there is no pair of chains to be gathered. The above processing for gathering will be described below.

In processing for gathering, first, a group of pairs of chains having the same partner chains of all pairs of chains is gathered as a new pair of chains. Next, the same partner chains are redefined as a partner chain 1 of the new pair of chains and in a group of pairs of chains before gathering, a group of the same partner chains is redefined as a partner chain 2 of the new pair of chains. Finally, a group of pairs of chains not gathered in a new group of pairs of chains is gathered, is redefined as a new set of pairs of chains and the next processing for gathering is executed.

As a result of gathering pairs of chains, a finally gathered pair of chains is set as a gate unit and the division of a group of gates with the same output is finished.

Referring to the drawings, one embodiment of reconstructing a gate will be described in detail below.

The present invention is operated by the processor shown in FIG. 2. In the present invention, MOS transistor circuit data 102 of input files 22 stored on a hard disk is input to the main memory 26 and CPU 21 executes each processing step based upon the input MOS transistor circuit data, inputting/outputting temporary data to/from the main memory 26. Finally, gate circuit data which is the result of transformation is output to work files 23.

Figure 28:
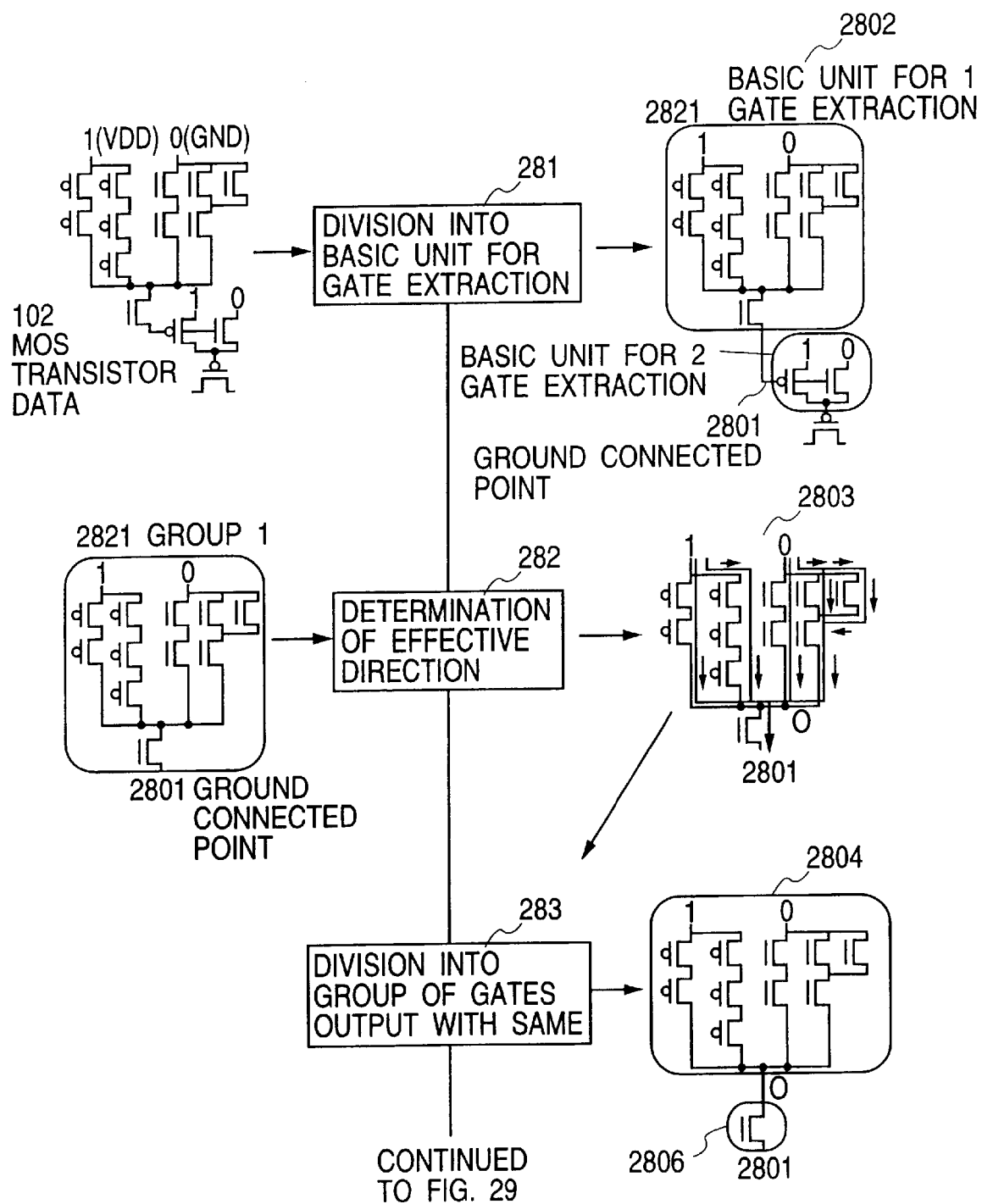
FIG. 28 shows a first half of the flow of the processing of the whole extraction of gates according to the present invention.
Figure 29:
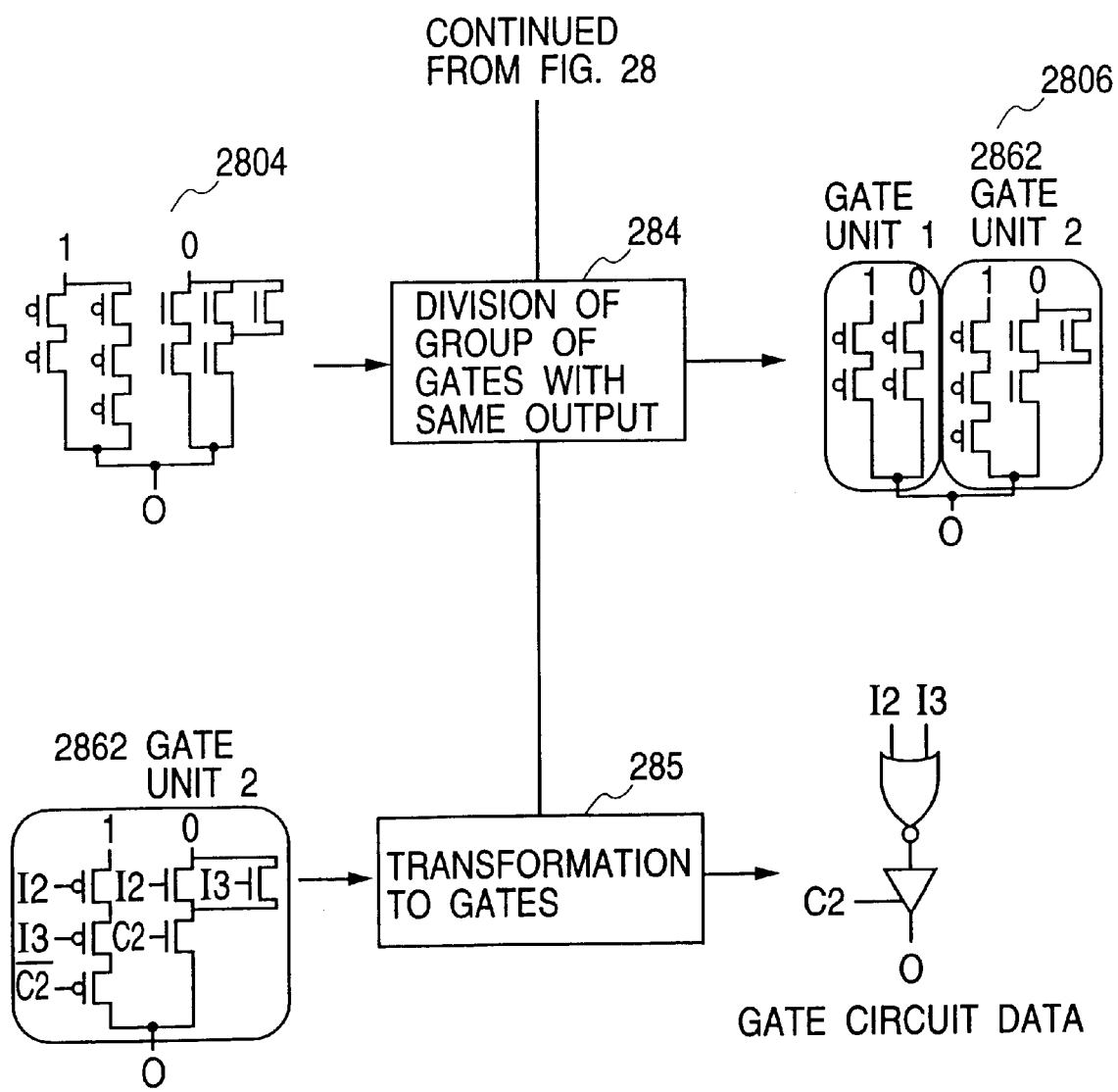
FIG. 29 shows a second half of a flow of the processing of the whole extraction of gates according to the present invention.

FIGS. 28 and 29 show a flow of the whole processing for extracting a gate according to the present invention.

In processing for extracting a gate, after division 281 into a basic unit for gate extraction and the determination of an effective direction 282 are performed as preparation, division 283 into a group of gates with the same output which is a basic unit and the division 284 of a group of gates with the same output into a gate unit are performed. Afterward, the transformation of gates 285 is executed. Each processing step will be described every the preparation (281 and 282), the division into a gate unit which is a basic unit for gate extraction (283 and 284) and the transformation of gates 285.

3.2.1.1.1 Preparation

For the division 281 into a basic unit for gate extraction, the MOS transistor data 102 is divided into a group in which the sources or the drains of MOS transistors are connected of MOS transistors. MOS transistor data 102 shown in FIG. 28 can be divided into two basic units shown as 2802.

For the determination of an effective direction 282, a group in a basic unit of MOS transistors the sources or the drains of which are connected is traced from a power or ground which is a logical source to a connection 2801 to a ground terminal and the direction of the trace is set as the effective direction of the group of MOS transistors. A MOS transistor having plural effective directions is a bidirectional transistor and the gate is not extracted. The effective direction of a basic unit for gate extraction 1 (2821) shown in FIG. 28 is shown by arrows in 2803.

3.2.1.1.2 Division into a Gate Unit which Is a Basic Unit for Gate Extraction

The following processing is a key for reconstructing a gate and its procedure is as described in above 3.2.1.1. Referring to an example of a circuit, a concrete processing procedure will be described below. Two steps of the division into a group of gates with the same output 283 and the division of a group of gates with the same output 284 respectively composing the above processing will be described below.

3.2.1.1.2.1 Division into a Group of Gates with the Same Output 283

The above is processing for dividing a basic unit for extracting a gate into a group of gates with the same output and is composed of two steps of the determination of a gate output point and a logical source and division into a group of gates with the same output utilizing these. Referring to FIG. 30, these steps will be described below.

(1) Determination of a Gate Output Point and a Logical Source

FIG. 30(b) shows a process of searching a gate output point and a logical source of a circuit 3001 shown in FIG. 30(a).

An initial value of a set of gate output points is a connection {O4} to a ground terminal and an initial value of a set of logical sources is {0, 1}.

In a first search, points O and O2 at which MOS transistor trace paths from logical sources 0 and 1 first cross are found as new gate output points. These are added to both sets of gate output points and logical sources.

In a second search, a point O3 at which MOS transistor trace paths from logical sources O and O2 first cross is found as a new gate output point. This is added to both sets of gate output points and logical sources.

As no more new gate output point is found, the search is finished. As a result, a set of gate output points {O4, O, O2, O3} and a set of logical sources {0, 1, O, O2, O3} are acquired.

(2) Division into a Group of Gates with the Same Output

When a logical source on a MOS transistor trace path immediately before a gate output point and a group of MOS transistors surrounded by the gate output point of each of the acquired gate output points are acquired, a group of four gates with the same output of M_O, M_O2, M_O3 and M_O4 shown in FIG. 30(c) is acquired. When the above circuit is divided into these groups, division into a group of gates with the same output is finished.

'2803' shown in FIG. 28 can be divided into two groups of gates with the same output 2804 and 2806 by the similar processing.

3.2.1.1.2.2 Division of a Group of Gates with the Same Output 284

Figure 31:
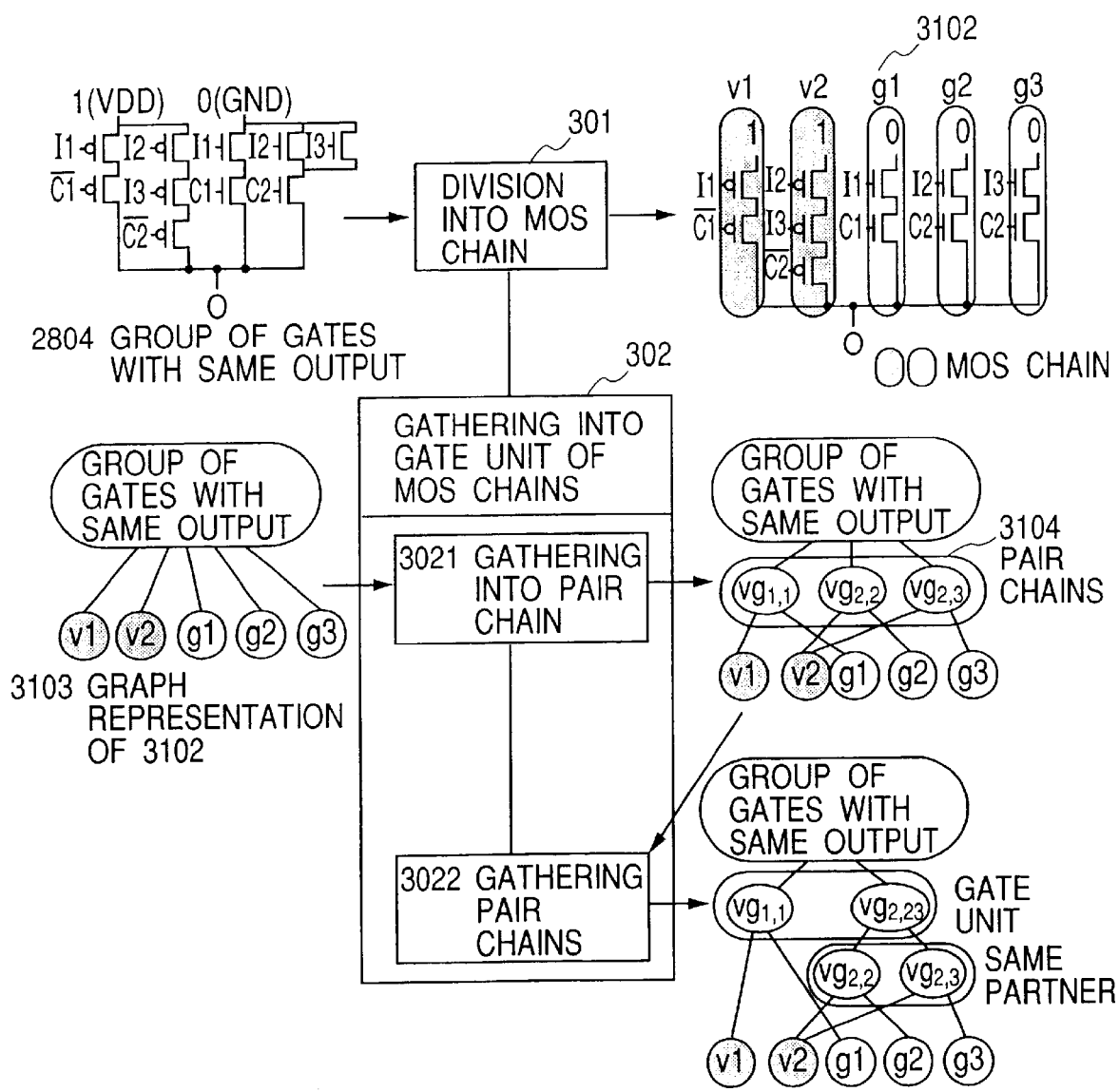
FIG. 31 shows a method of dividing into a group of gates with the same output in a step 284.

The above is processing for dividing a group od gates with the same output into a gate unit and as shown in FIG. 31, the above processing is composed of two steps of separation into aMOS transistor chain 301 and the gathering of MOS transistor chains into a gate unit 302. These steps will described in the following (1) and (2) referring to FIG. 31 using the group of gates with the same output 2804 acquired in FIG. 28 as an example.

(1) Division into a MOS Transistor Chain 301

The above is processing for separating the group of gates with the same output 2804 into a group of MOS transistors on one MOS transistor trace path from each logical source to a gate output point, that is, a MOS transistor chain. '2804' can be separated into five MOS chains of v1, v2, g1, g2 and g3 as shown in 3102. "v1 and v2" are a chain of logical sources 1 and "g1, g2, g3" are a chain of logical sources 0.

(2) Gathering MOS Chains in a Gate Unit 302

The above is processing for sequentially gathering MOS chains in a gate unit and is composed of gathering in a pair of chains 3021 and the gathering of pairs of chains 3022.

(a) Gathering in a Pair of Chains 3021

The above is processing for gathering two MOS transistor chains and for a condition for gathering, a condition shown in FIG. 32(a) is applied. A first condition is the condition described in (2)(b) in the item of 3.2.1.1 and a second condition is a condition for preventing data from being simultaneously transferred from logical sources. In the second condition, the logic of transfer from a logical source means logic for determining a condition for transfer from a logical source and an NMOS transistor chain and a PMOS transistor chain are each acquired owing to difference between switching characteristics as shown in FIG. 32(b).

Of five MOS chains shown as 3102 in FIG. 31, three pairs of (v1, g1), (v2, g2) and (v2, g3) meet the above condition for gathering and these pairs are gathered in pairs of chains of (vg1, 1), (vg2, 2) and (vg2, 3) shown as 3104.

(b) Gathering Pairs of Chains 3022

The above is processing for gathering pairs of chains generated in above (a) and generating the maximum group of MOS transistors which meets a gate condition. All pairs of chains with the same output are gathered in partner chain, the gathered pairs of chains are redefined as a new pair of chains and again, gathering is repeated.

In a group of pairs of chains 3104 shown in FIG. 31, there are two pairs of chains having the same partner chain v2 (vg2,2) and (vg2,3) and a new pair of chains (vg2, 23) is generated by gathering these. A new partner chain 1 of (vg2, 23) is v2 and a new partner chain 2 is g23 acquired by gathering the partner chains g2 and g3 of v2 in the preceding pair of chains. As a result, a new group of pairs of chains is composed of (vg1,1) and (vg2, 23) and as these have no same partner chain, processing for gathering is finished. If pairs of chains having the same partner chain exist, processing for gathering is continued.

Pairs of chains (vg1,1) and (vg2, 23) acquired as the result of the above processing are a gate unit. When these are represented in a MOS circuit based upon the previous group of gates with the same output 2804, they can be divided into a gate unit 1 and a gate unit 2 (2862) as shown as 2806 in FIG. 29. The former is (vg1,1) and the latter is (vg2, 23).

3.2.1.1.3 Transformation of Gates 285

Each gate unit acquired as the result of processing described in the item of 3.2.1.1.2 is transformed into a gate according to processing procedure described in FIG. 33.

First, a group of MOS transistors is transformed in the presentation of a tri-state element. Concretely, a group of MOS transistors having the same logical source is transformed into one tri-state element having the transfer logic of the logical source as control logic. (vg2,23) becomes a result shown in FIG. 33(*a*).

Plural tri-state elements acquired as a result are gathered in one tri-state element according to a gathering rule shown in FIG. 33(*b*). The above gathering rule is a rule acquired by combining a truth table of the tri-state elements and a truth table when two elements share output.

When the gathering rule shown in FIG. 33(*b*) is applied to the result shown in FIG. 33(*a*), the result of transformation showing a tri-state gate is acquired as shown in FIG. 33(*c*).

The result of the above transformation shows that the control terminal C2 of the tri-state gate is included in a data logical circuit 331. The above inclusion occurs because the data logical circuit 331 having meaning for gate output only when C2 is 1 includes redundant logic when C2 is 0. To remove the above redundant logic, the data logic is divided by control. Division by control is processing for converting data logic to logic when control is 1.

As a result of the division, the control terminal C2 is not included in the data logical circuit 331 and the data logical circuit becomes a tri-state NOR gate shown in FIG. 33(*d*).

3.2.1.2 Reconstruction of a Bistable Circuit

The reconstruction of a bistable circuit is a process enabled by storing a transformation rule every pattern type in the processor and it is utilized that a bistable circuit is composed based upon the loop of gate circuits to reconstruct a bistable circuit. FIG. 8 shows only an example of a pattern of reconstruction. In this example, each transformation of a cross type and a tri-state loop type of NOR gates is shown.

3.2.2 Step 12: Search of First and Last Bistable Circuits and the Related Circuits The above step is a step for executing two processing for searching a first bistable circuit and the related circuits and searching a last bistable circuit and the related circuits and for recognizing the related circuits. FIGS. 9, 10, 11 and 12 show the outline of the two processing for a search and a range of the search and they will be described below.

Figure 9:
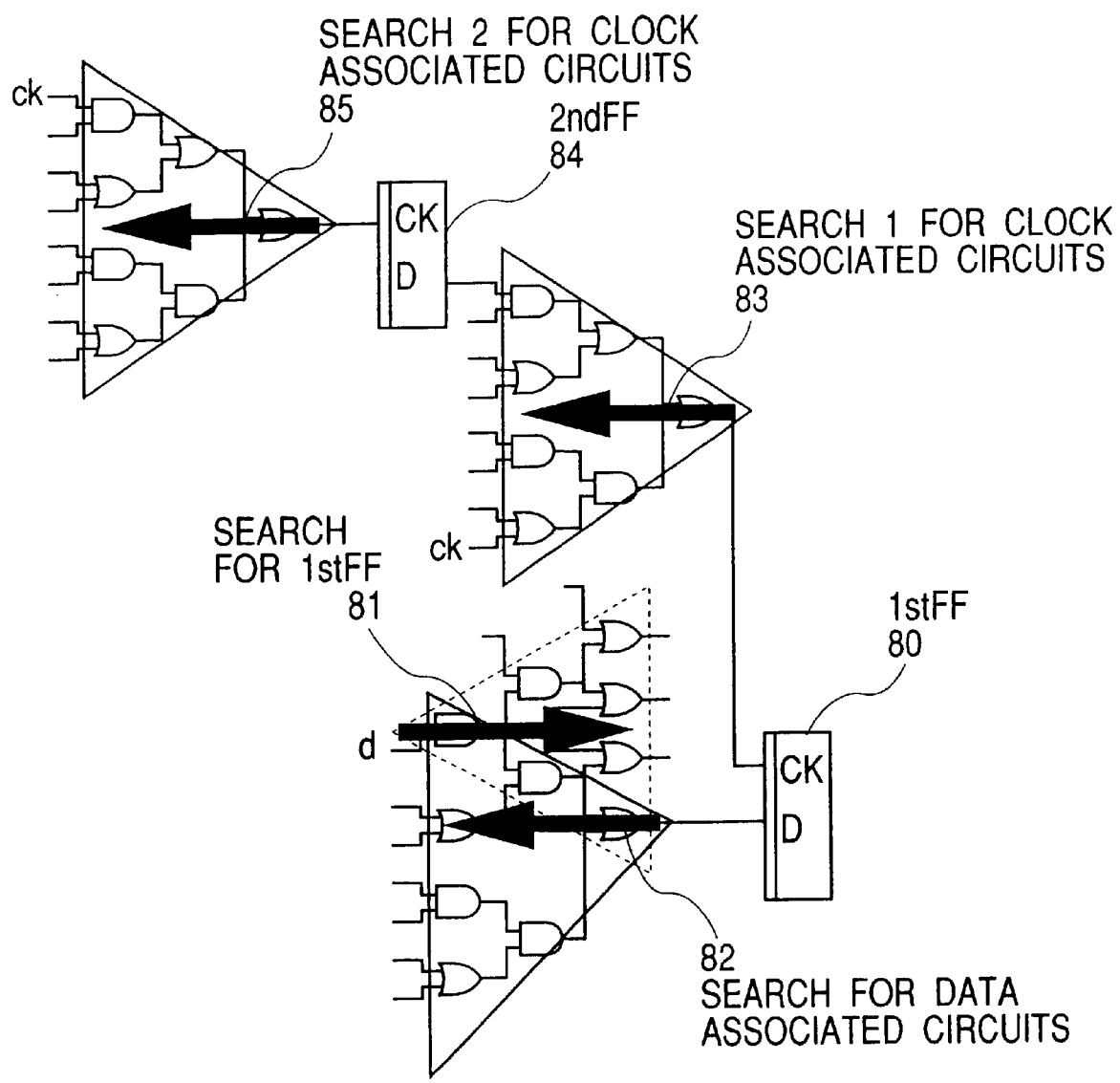
FIG. 9 is an explanatory drawing for explaining a method of searching a first bistable circuit and its associated circuits, FIG. 10 explains a range of the search of the first bistable circuit and its associated circuits, FIG. 11 explains a method of searching a last bistable circuit and its associated circuits, FIG. 12 explains a range of the search of the last bistable circuit and its associated circuits, FIG. 13 show the search 1 of a delay measuring path.

(a) The search of the first bistable circuit and the related circuits is composed of the search 81 of the first bistable circuit shown in FIG. 9, the search 83 and 85 of a clock related circuit and the search 82 of a data related circuit.

The search 81 of the first bistable circuit is a step for searching gate circuits in the direction of each output terminal with input d set as a starting point and setting a bistable circuit as the first bistable circuit when the search reaches the data terminal D of the bistable circuit. However, if in a process for search, there is a signal input to an element except a gate circuit, the above search is executed according to the search of the first bistable circuit shown in FIG. 10. For a multi-driven signal the output of which a gate shares with another gate or a bistable circuit, as a case that identical gates are connected in parallel as 2001 to enhance driving ability is frequent, search is continued regarding any gate as a target if multi_drive shown as 40 in FIG. 5 is specified in the auxiliary information 101.

The search of a clock related circuit is a step for searching on the side of an input terminal with the clock terminal of the first bistable circuit 80 as a starting point until the search reaches a clock ck and setting circuits in the searched range as related circuit. This step is characterized in that not only a gate circuit but the second bistable circuit 84 are considered. More generally, the arbitrary number of bistable circuits can be similarly dealt, however, as an example, if bistable circuits up to the second bistable circuit are considered, it can be said that the search is enough. The consideration of the second bistable circuit is the same as the consideration of a clock in one cycle period for a clock in the first bistable circuit and such configuration is often used in a counting-down circuit.

Processing for the search of a clock related circuit is composed of a step 83 for searching from the clock terminal of the first bistable circuit 80 to the terminal of the whole circuit or to the second bistable circuit 84 and a step 85 for searching from the clock terminal of the second bistable circuit 84 to the terminal of the whole circuit. However, in a process for the search, if there is a signal input to an element except a gate circuit, the search is performed as shown in FIG. 10. A multi-driven signal is dealt as in the search for the first bistable circuit.

The search of a data related circuit is a step for searching gate circuits from the data terminal of the first bistable circuit 80 to the terminal or to an endpoint node of a bistable circuit in the direction of an input terminal. However, in a process for the search, if there is a signal input to an element except a gate circuit, the search is dealt as shown in FIG. 10.

Figure 11:
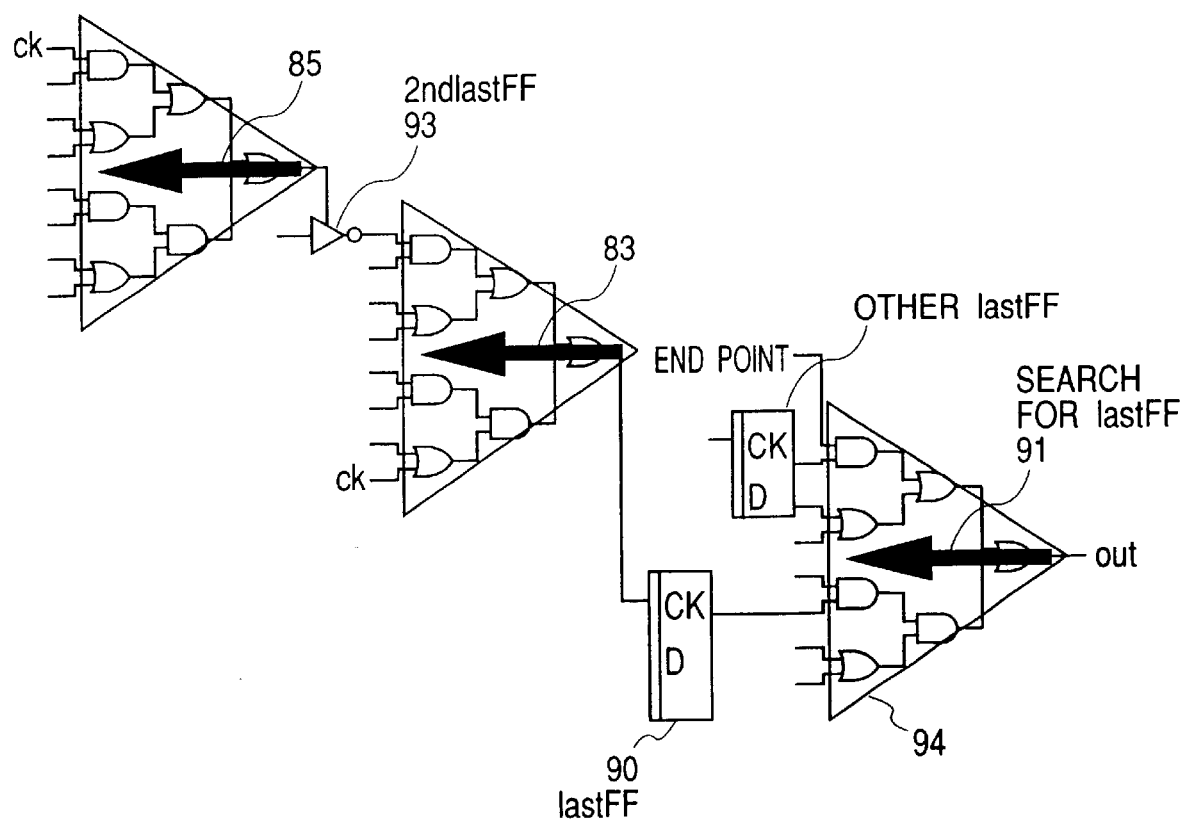

(b) The search of the last bistable circuit and the related circuits is composed of the search 91 of the last bistable circuit shown in FIG. 11, the search of a clock related circuit of the last bistable circuit by the same processing 83 and 85 as the search of a clock related circuit of the first bistable circuit and the search 94 of an output data related circuit of the last bistable circuit.

The search 91 of the last bistable circuit is a step for searching gate circuits in the direction of an input terminal with the output terminal OUT set as a starting point and setting the output terminal of a bistable circuit as the last bistable circuit when the search reaches the output terminal of the bistable circuit. However, in a process for the search, if there is a signal input to an element except a gate circuit, the search is dealt as the search of the last bistable circuit shown in FIG. 12. A multi-driven signal is dealt as in searching a clock related circuit of the first bistable circuit.

In the search of a clock related circuit of the last bistable circuit, the same processing 83 and 85 as in the search of a clock related circuit of the first bistable circuit is executed with the clock terminal of the last bistable circuit set as a starting point.

The search 94 of an output data related circuit of the last bistable circuit is a step for setting a cone having the output terminal OUT at its vertex, having the same endpoint node as in the search of a data related circuit shown in FIG. 9 and having all the last bistable circuits as an endpoint node of a gate as a related circuit.

3.2.3 Step 13: Search of a Delay Measuring Path

In the above step, to statically measure the delay of a transistor circuit, all paths from the terminal to be measured of the related circuit acquired in the step 12 to the end point are provided to the delay measuring step 15. Normally, in static delay measurement, as the delay of a path functionally impossible called a false path is also measured, a false path is removed at the level of a reconstructed gate circuit and the efficiency of the delay measuring step is enhanced.

Below, first, the outline of a method of searching an effective path in a combinational circuit using an example of a simple circuit will be shown and next, a method of searching a path that passes a bistable circuit will be described.

For the search of a path in a combinational circuit, there are many well-known examples such as p. 1323 to 1335 of "DYNAMITE: An Efficient Automatic Test Pattern Generation System for Path Delay Faults", IEEE Transaction on CAD, vol. 10, No. 10 written by Karl Funchs et al. and published in October, 1991. For the preparation of the search of a path including a bistable circuit, only the outline of a method of searching a simple circuit without reconvergent structure shown in FIG. 13($a$) will be described below. As shown in FIG. 13($a$), C denotes the end point of a path and CKI denotes a starting point. Suppose that a path when C is activated is searched. At this time, the path is from CKI to C via P1. Each gate is checked by one level on the side of an input terminal on this path and the condition to be met of the change of a signal on the path to change on the side of output and a signal off the path is acquired. In a case shown in FIG. 13($a$), it is known from agate at a first level that a signal P1 on a path is required to be at a high level and a signal C1 off the path is required to be 0. It is known from a gate at a second level that CKI is required to be at a high level and a signal C2 off the path is required to be 1. Therefore, for a condition for passing the path (a path activating condition), the starting point CKI is at a high level and (C1=0 and C2=1). For the latter condition, when C1 and C2 are the output of another gate, the logical operation of whether this condition is 0 or not is executed and if the condition is not 0, the path is an effective path.

A path passing a bistable circuit can be searched by sequentially performing the search of a path in the above combinational circuit. Suppose that a path shown in FIG. 13($b$) from the input of a clock CKI to the clock terminal of the first bistable circuit is acquired. In this circuit, the first bistable circuit is FF1 and the second bistable circuit is tri1 and FF2. In the search of a path that passes the second bistable circuit, the determination of an effective path when the output of a certain second bistable circuit, for example tri1 varies can be judged by whether AND of a condition for determining an effective path from the output of tri1 to 1st FF and a condition for determining an effective path from CKI to tri1 is not 0 or not. In an example shown in FIG. 13($b$), when FF1 and tri1 are both active, it is determined whether AND of a path activating condition from S1 to FF1$ck$ and a path activating condition from CKI to tri1$ck$ (the signal C1) is 0 or not. The former condition is that S1 is at a high level and (I1 and S2 and S3=1), the latter condition is that CKI is at a high level and (I3=1) and when AND of these is not 0, the path is an effective path.

FIG. 14 shows what is acquired in cones 111, 112 and 113 between each FF for applying the above method of searching a path to three overall paths to be acquired, that is, from a clock to output (for output delay), from a clock to 1st FFck (for a timing rule) and from input to 1st FFd (for a timing rule) and a condition for finding an effective path. For example, to acquire a path from a clock to 1st FFck, when a clock is input to a first cone, a path fit for a condition for activating from a clock to 1st FFck (a) is acquired and if there is the second bistable circuit, a path fit for a condition for activating from FF2out to 1st FFck (b) is acquired. In a second cone, a path for activating from a clock to a path FF1$ck$ (c) is acquired. A path that passes a bistable circuit is effective when AND of the path activating condition (a) and the path activating condition (b) is not 0.

In FIG. 14, a path both for output delay and for a timing rule from the clock terminal (the former is the clock terminal of a path FF1 and the latter is an end point) of a bistable circuit that determines timing to the second bistable circuit is considered, however, more generally, if n pieces of bistable circuits for generating a clock divided into 2n are dealt, a condition for making an overall path effective can be also acquired by sequentially ANDing a path activating condition similarly.

The effective path acquired as described above is output to a delay measuring path file 104 and this step is finished.

3.2.4 Step 14: Generating an Activating Condition

This step is executed without using a method of ORing all path activating conditions used for determining an effective path in the step 13. As a method of ORing path activating conditions takes much processing time, a method of acquiring activating conditions collectively is shown. As an activating condition is used for generating a timing rule, it is acquired by generating a clock activating condition from a clock to 1st FF and a data activating condition from input to 1st FF.

FIG. 15 shows a method of generating a clock activating condition and the method will be described below. This method is a method of sequentially ANDing the activating conditions of the cones between bistable circuits similarly in acquiring a condition for determining an effective path. This time is similarly a case up to the second bistable circuit. It is similarly easy to expand up to an nth bistable circuit.

The clock activating condition is an activating condition in consideration of the activating condition of the first cone in case a clock CK is input to the first cone and the second bistable circuit as in an expression 121 shown in FIG. 15.

For the activating condition of the first cone, there are four conditions depending upon whether the first bistable circuit is active (turned on) or not active and whether the starting point CK is not active or active. The expression 122 shows the conditions. As all are similar, only a first expression will be described below. As a clock input to the first bistable circuit is at a high level, 0, that is, h (CK=a value before variation)=0 before variation if Boolean function of the first cone is h and when h (CK=a value after variation)=1, the clock terminal of the first bistable circuit is activated. Therefore, under a condition for activating CK, when not (h (CK=0)) and h (CK=1)=1, activation in which the first bistable circuit is activated occurs. A first expression of the expression 122 shows the above.

An activating condition in consideration of the second bistable circuit is acquired by a condition for turning on the second bistable circuit <1> and for changing the output of the second bistable circuit and turning on 1st FFck <2>. An expression 123 shows the above. The condition <1> and <2> can be acquired by expressions 124 and 125 corresponding to the first cone and the second cone. It is required to be noticed that in the expression 125, the output of the second bistable circuit before variation is S and an inside state S when a clock varies at a terminal appears in an activating condition. This point is different from a case that an activating condition is acquired by only a combinational circuit.

FIG. 16 shows an example of the calculation of the clock activating condition. The activating condition of the first cone and the activating condition of a path that passes tri1 in the second bistable circuit are sequentially acquired by expressions shown in FIG. 15. Both conditions are effective only when CK is activated and are respectively represented by expressions 134 and 135.

Next, FIG. 17 shows a method of generating the data activating condition. The data activating condition is different from the clock activating condition in that the second bistable circuit is not considered and a condition on which variation occurs is acquired without limiting whether the end point of variation is active or not. Therefore, the clock activating condition, conditions when the first cone is activated and when it is deactivated of the activating condition 122 of the first cone shown in FIG. 15 are ORed. Finally, as shown in 142, the activating condition of the first cone is represented by the exclusive-OR of a case that input IN=0 and a case that IN=1.

3.2.5 Step 15: Measuring Delay

In this step, transistor circuit data 102 is input and delay on the effective path of the delay measuring path 104 generated in the step 14 is measured by a static delay measuring tool at a transistor level. The acquired delay is stored in the delay file 106. There is a well-known static delay measuring tool at a transistor level and it is utilized.

3.2.6 Step 16: Generating Timing Characteristics

This step is a step for applying the method described in the modeling method shown in FIG. 4 to each terminal based upon the delay file 106, the bistable circuit timing rule 107 and the activating condition 105 and generating a timing characteristic library 108 shown in FIG. 6.

For a timing parameter, the skew (a lag of timing of a signal) of delay from a clock to 1st FFck 32 and delay from input to 1st FFd 33 in each first bistable circuit of each input is calculated and the timing parameter of input shown in FIG. 4 is calculated based upon the above skew and a bistable circuit timing rule. Simultaneously, a condition fit for the rule shown in FIG. 4 is generated based upon the activating condition 105 and description shown in 55 and 56 in FIG. 6 is output to a timing characteristic library 108 together with the fit condition.

For output delay, the maximum path delay value is calculated based upon the delay file 106 as shown in FIG. 4 and output delay description 57 shown in FIG. 6 is output to the timing characteristic library 108.

Items 51 to 53 shown in FIG. 6 are automatically or manually added to the completed timing characteristic library and the timing characteristic library is used for a model for timing verification together with a functional model. How to use the timing characteristic library will be described in an item 4.

4. A Method of Using the Timing Characteristic Library

FIG. 18 shows an example of how to use the timing characteristic library 108.

FIG. 18(a) shows an image of the simulation of system LSI. The existing design logic such as CPU core, DMAC and a timer system LSI is built in system LSI as a module and new design logic is generated and added. When system LSI is verified in simulation, the existing module adds timing characteristics generated according to the present invention to the upper-level hierarchy of a functional model as shown in an example of CPU core 156 and simulates.

At this time, it is an output delay part 1511 that adds delay to the result of the output of the functional model and it is a timing rule check part 1512 that checks whether an input signal is fit for a timing rule or not. If a timing error is detected by the timing rule check part, the timing error is displayed and the designer reconsiders a designed circuit based upon the result.

Figure 25:
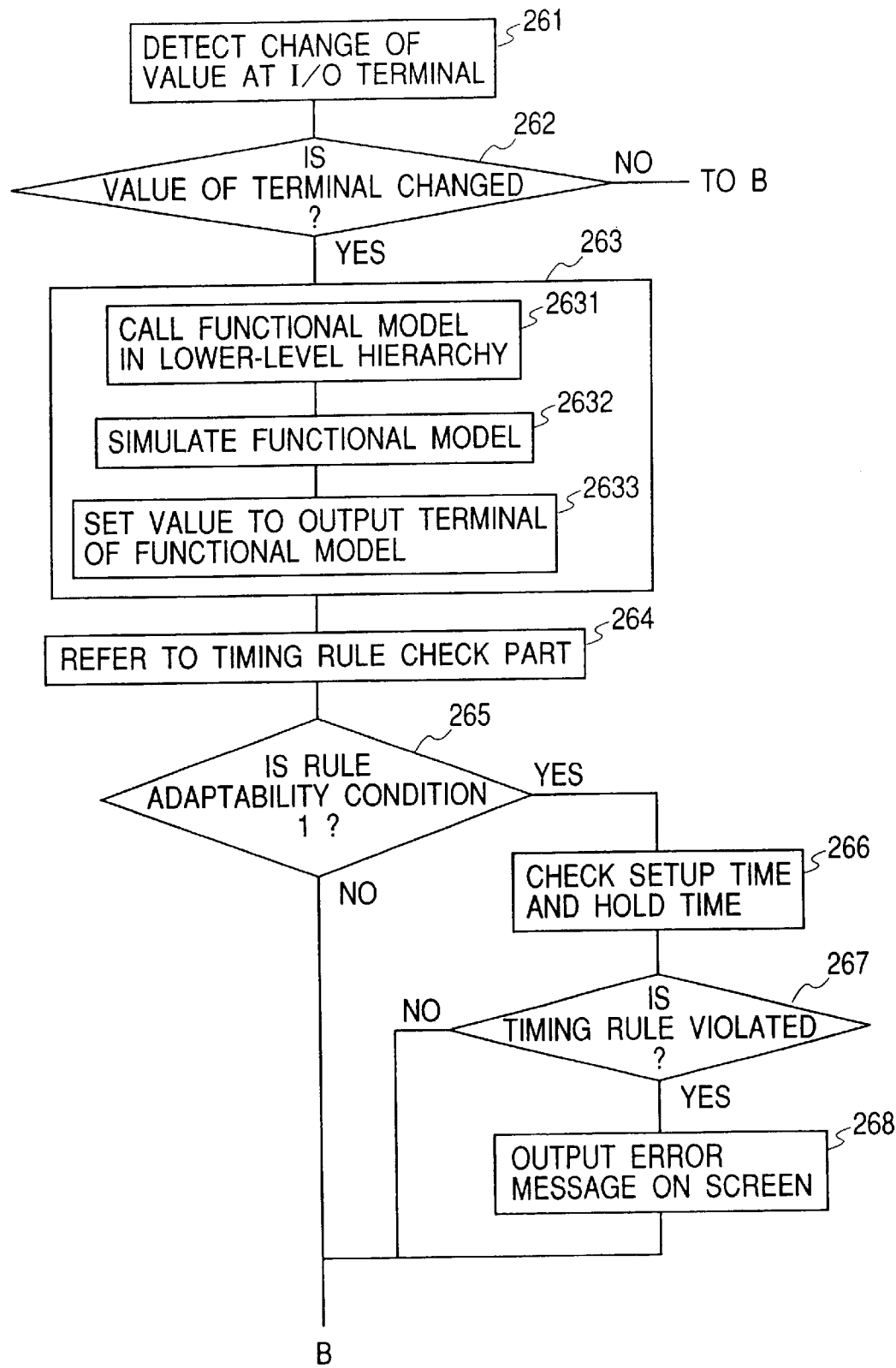
FIG. 25 is a flowchart showing the simulation processing 1 of the timing characteristic library.
Figure 26:
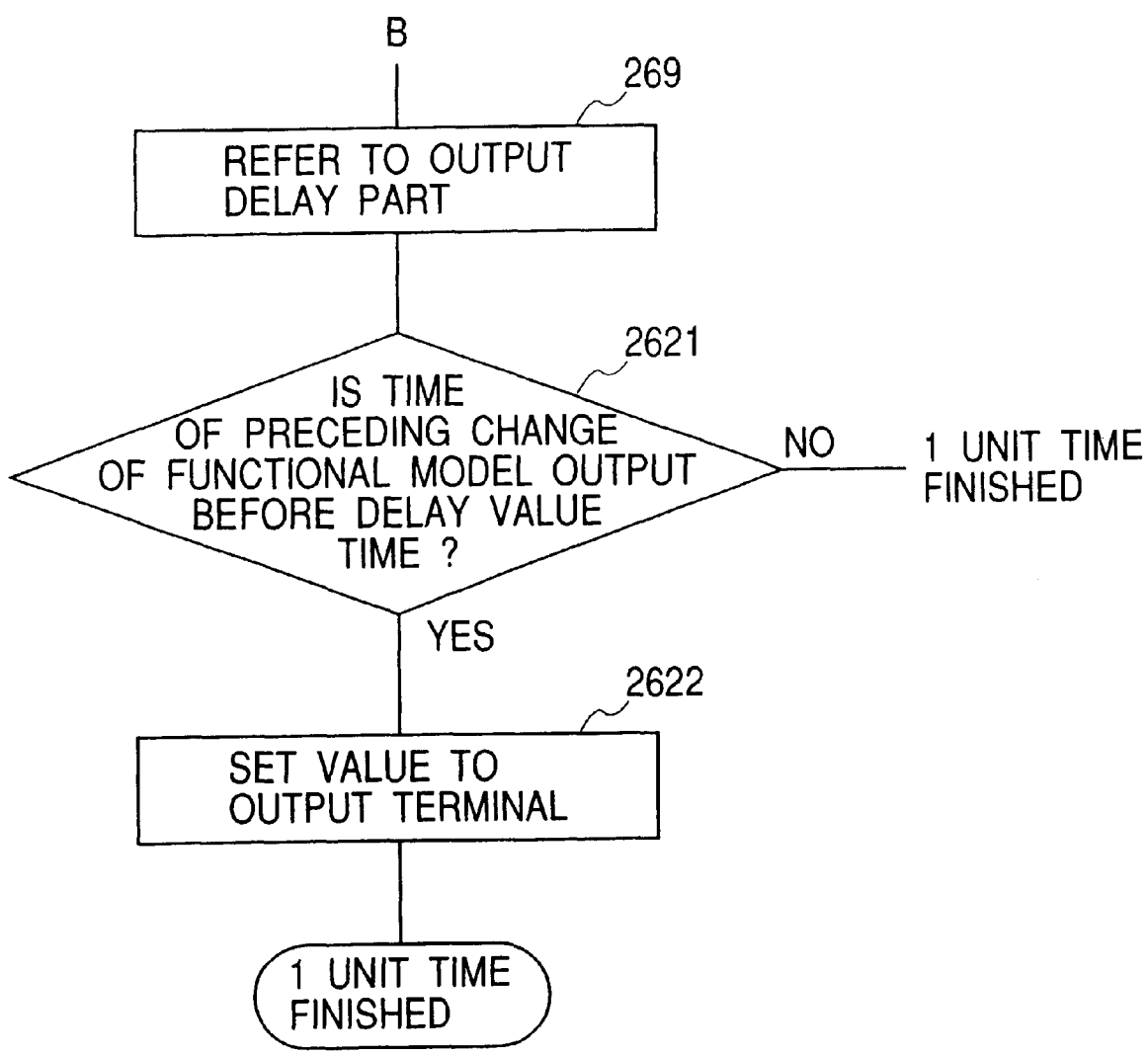
FIG. 26 is a flowchart showing the simulation processing 2 of the timing characteristic library.

FIGS. 25 and 26 show the simulation processing of the timing characteristic library. For simulation, unit time is generally set and simulation is performed every unit time. FIGS. 25 and 26 show simulation processing in unit time.

First, the variation of a value at an input/output terminal of the whole module or a functional model instance is detected in a step 261, if the value varies, processing in a step 263 and the succeeding steps is executed and if the value is unchanged, processing in a step 269 and the succeeding steps shown in FIG. 26 is executed.

The processing in the step 263 and the succeeding steps will be described below. In the step 263, a functional model in a lower-level hierarchy is called (2631), the functional mode is simulated (2632) and finally, a value is registered at the output terminal of the functional model. In a step 264, the timing rule check part is referred and first, it is checked whether a condition fit to the rule is met or not in a step 265. If the condition fit for the rule is met, setup time and hold time are checked in a step 266, if a timing rule is disobeyed in a step 267, an error message is output on a screen and if the timing rule is kept, processing succeeding B shown in FIG. 26 is executed.

The processing succeeding B shown in FIG. 26 will be described below. The processing is output delay processing. First, the output delay part is referred in a step 269 and if time when the output of a functional model varies last time is before time equivalent to a delay value (2621), a value is registered at the output terminal of the whole module and the processing at one unit time is finished.

Hereby, the check of timing between a new designed logical circuit and a module or between modules is enabled. That is, when the disobedience of timing is detected by the timing rule check part built in the model of each module, a timing error is displaced, the designer reconsiders the designed circuit based upon the result or he/she adds a buffer between modules.

FIG. 18(b) shows the system configuration when system LSI is simulated. The result of simulation and a timing error are output by inputting a module library 152, the design data of a new designed logical circuit 153 and input waveform data 155 to a hardware description language (HDL) simulator. The generated timing characteristic library and functional model library are stored in a storage medium individually or as an integrated module library.

5. Second Embodiment

FIG. 19 shows a second embodiment and the second embodiment will be described below.

It is a method of removing a path fit for a certain condition from the calculation shown in <2> included in the expression 123 in the calculation of the activating condition 123 in consideration of the second bistable circuit for generating the clock activating condition shown in FIG. 15 that is shown in FIG. 19. A condition for removing will be described using the circuit shown in FIG. 16 as an example below.

There is a case that when a path 133 shown in FIG. 16 is activated, a path 137 is also simultaneously activated and as two inputs to a gate 138 both become a high level, the clock terminal of FF1 becomes a high level. This reason is that a path that passes a bistable circuit receives the change of a clock in the first cone 131 and propagates the change. However, such a path which propagates change simultaneously when a clock varies is normally inhibited and particularly, if a path that passes a sequential circuit and a path of a clock for determining timing simultaneously propagate change, it is difficult to design timing. This may be considered a false path which cannot be determined because a path is statically considered.

For the above reason, the following activating condition means a method of removing a path that propagates change simultaneously when a clock varies based upon <2> in the expression 123.

To remove a path that propagates change simultaneously, the condition shown in <2> has only to be met whether a clock is at a high level or a low level. That is, the expression 125 is changed to an expression 161. Hereby, the activating condition of the second bistable circuit on a path that passes S1 in an example of a circuit shown in FIG. 16 is as shown in an expression 162. This condition is met only when S2=0. That is, a path 137 is inhibited by changing S2 to 0 at a gate 139.

It is not known even if a circuit is statically analyzed which of the above method and the method shown in FIG. 15 is better. It depends upon the character of a designed circuit. In an actual situation, a designer can select every circuit. Actually, the execution of a system is often controlled by a control file. The details are omitted.

6. Third Embodiment

Figure 20:
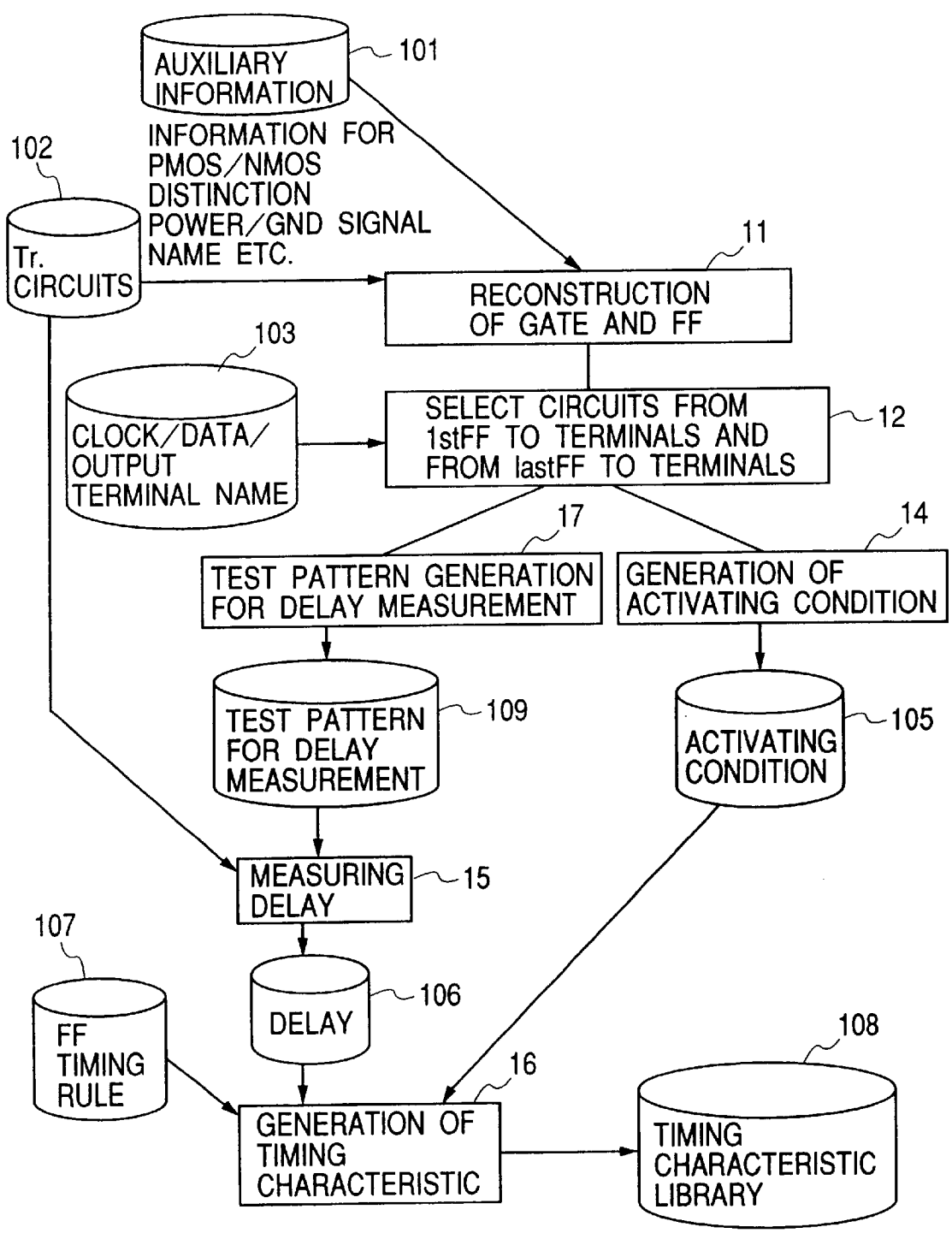
FIG. 20 is a flowchart showing the whole timing characteristic extracting method 3.

FIG. 20 shows a third embodiment and the third embodiment will be described below.

In this embodiment, a test pattern for measuring delay 109 is used in place of the delay measuring path 104 shown in FIG. 1 in the first embodiment, the test pattern for measuring delay is generated 17 in place of generating the delay measuring path simultaneously and a method of measuring delay is changed to a method of dynamic simulation at a transistor circuit level.

A test pattern is generated every path and is a pattern that meets the path activating condition shown in FIG. 13.

For example, in the example shown in FIG. 13(*a*), a pattern initially set to C1=0 and C2=1 and a pattern that the initial value 0 of CKI is changed to 1 when delay is measured are prepared. When delay is measured, C1 and C2 including an internal signal are set to the above pattern before simulation, the pattern that CKI is changed from 0 to 1 is applied to simulation and delay is measured. A pattern that passes a bistable circuit shown in FIG. 13(*b*) is changed equalizing the activating condition of each cone. Further, the output S1 of an intermediate bistable circuit (tri1 in FIG. 13(*b*)) is set to the initial value of change (0 in the example of this circuit) and input to the bistable circuit is set so that S1 is a value after change when the clock terminal C1 becomes active.

As in the above method, initial setting and setting after change are performed for only related circuits, the effect of other circuits is small and processing time is greatly reduced, compared with processing time in the simulation of the whole circuit.

7. Fourth Embodiment

Figure 21:
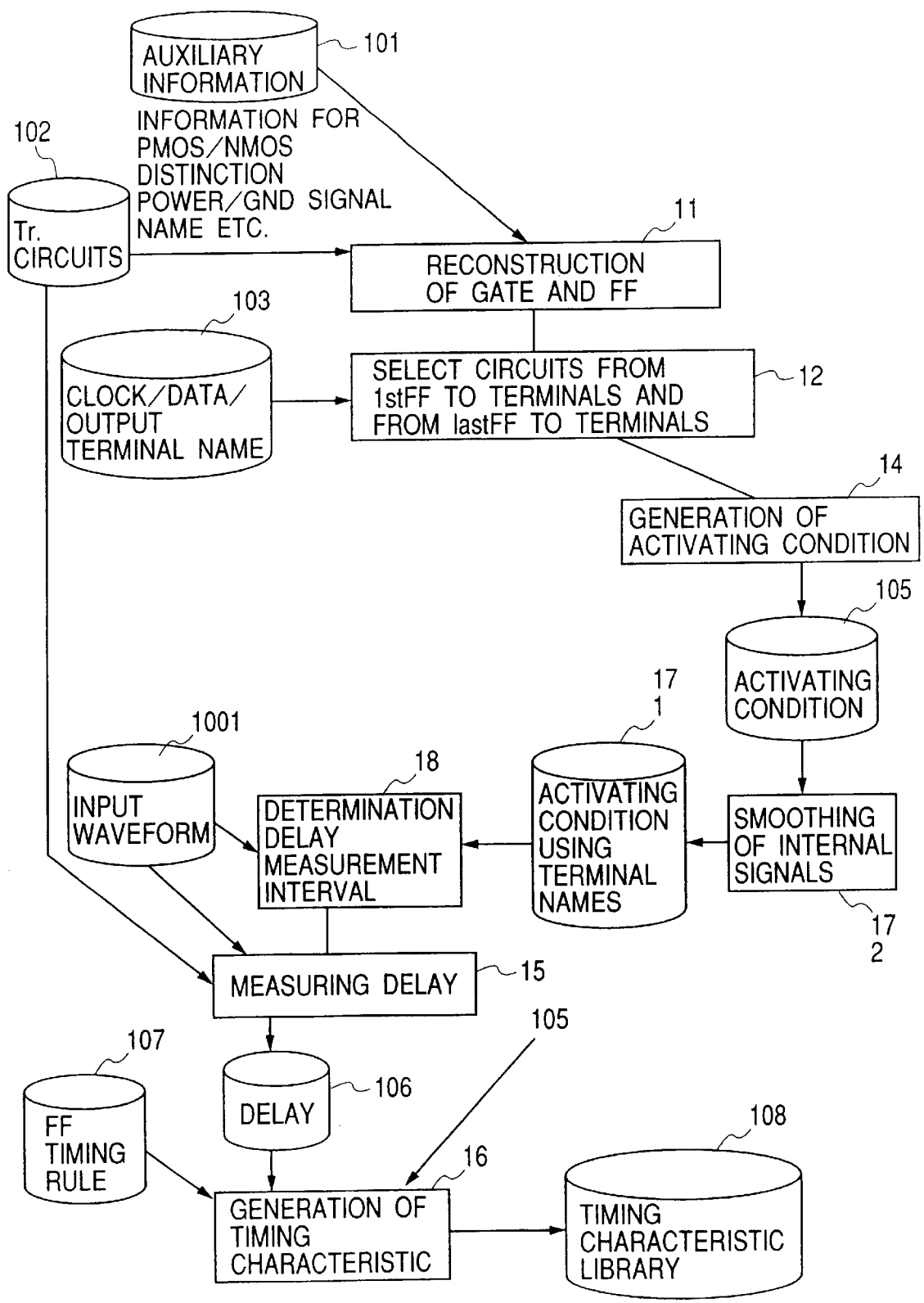
FIG. 21 is a flowchart showing the whole timing characteristic extracting method 4.

FIG. 21 shows a fourth embodiment and the fourth embodiment will be described below.

In this embodiment, delay is measured by dynamic simulation as in the third embodiment, however, differently from the third embodiment, a waveform 1001 is input and time which an activating condition meets is automatically determined based upon the activating condition (delay measuring time is determined 18). However, as an activating condition also includes an internal signal, the smoothing 172 of an internal signal, that is, OR operation of all internal signals in case an internal signal included in the activating condition is 0 and in case the above signal is 1 is executed and time is determined based upon the activating condition 171 of the terminal.

8. Fifth Embodiment

Figure 22:
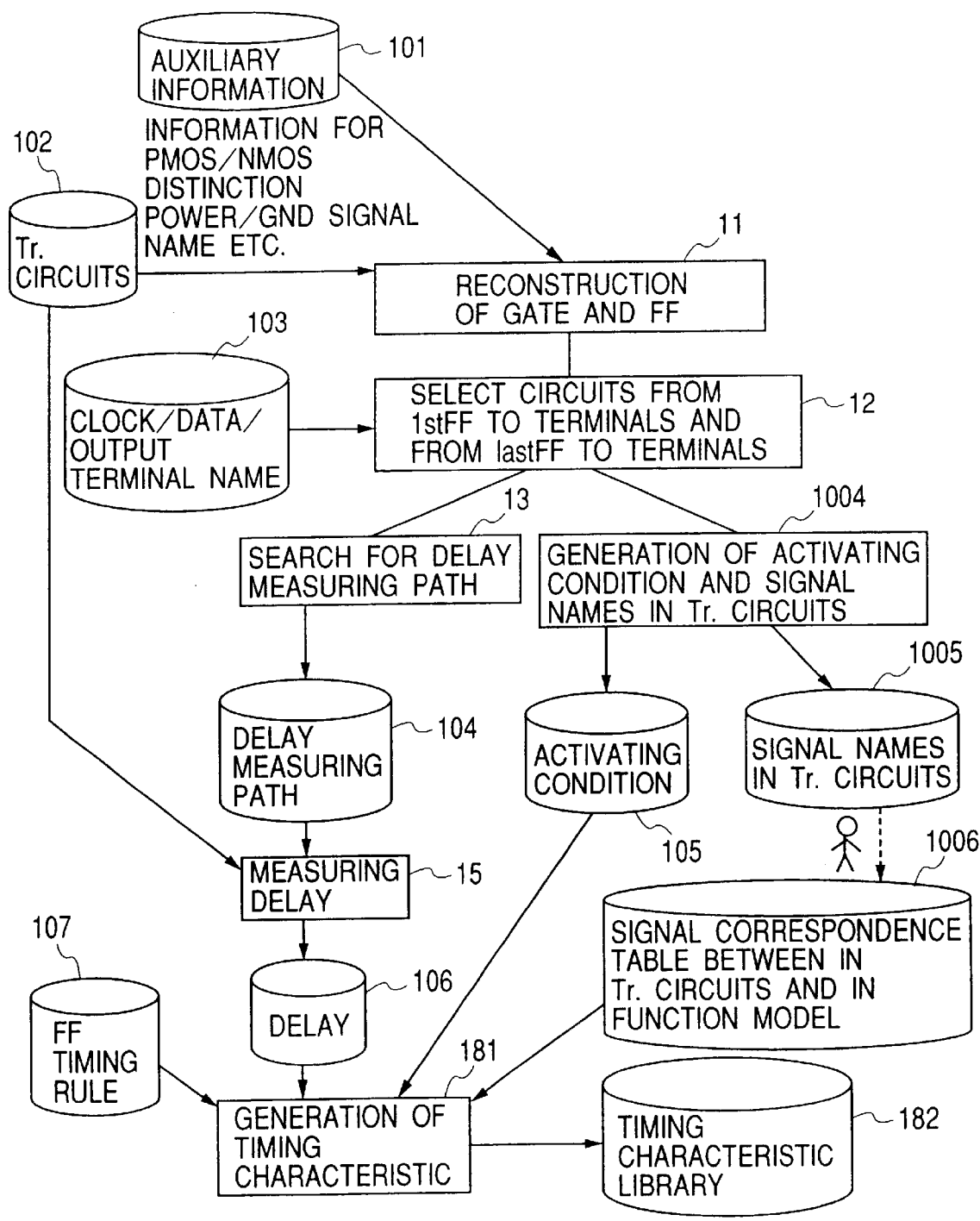
FIG. 22 is a flowchart showing the whole timing characteristic extracting method 5.

FIG. 22 shows a fifth embodiment and the fifth embodiment will be described below.

This embodiment is provided to solve a problem that if the signal name of a transistor circuit and the signal name of a functional model are different, simulation shown in FIG. 18 cannot be realized unless the signal name of the transistor circuit is manually modified. Particularly, if an internal signal is included in an activating condition, a manhour for modifying manually is great and the above method is effective. Many activating conditions may occur in case inversion shown in FIG. 10 is caused by output from a bistable circuit, a multi-driven signal, VCC, GND or lifting and in case the second bistable circuit is considered in a clock activating condition.

In this embodiment, processing for outputting the signal name of a transistor circuit used for the activating condition in the step 14 shown in FIG. 1 is added and the step 14 is changed to a step 1004. In the step 1004, an activating condition 105 and the used transistor circuit signal 1005 are output. Next, the name of a signal corresponding to the transistor circuit signal in a functional model is manually input and a correspondence table 1006 between the transistor circuit signal and the functional model signal is generated. Finally, timing characteristics are generated 181 based upon the above correspondence table 1006 in addition to another input files 106 and 107. The timing characteristics are generated 181 by converting the name of the transistor circuit signal that emerges in an activating condition when a timing characteristic library 182 is output to the name of the functional model signal and the timing characteristic library 182 is output.

9. Sixth Embodiment

Figure 23:
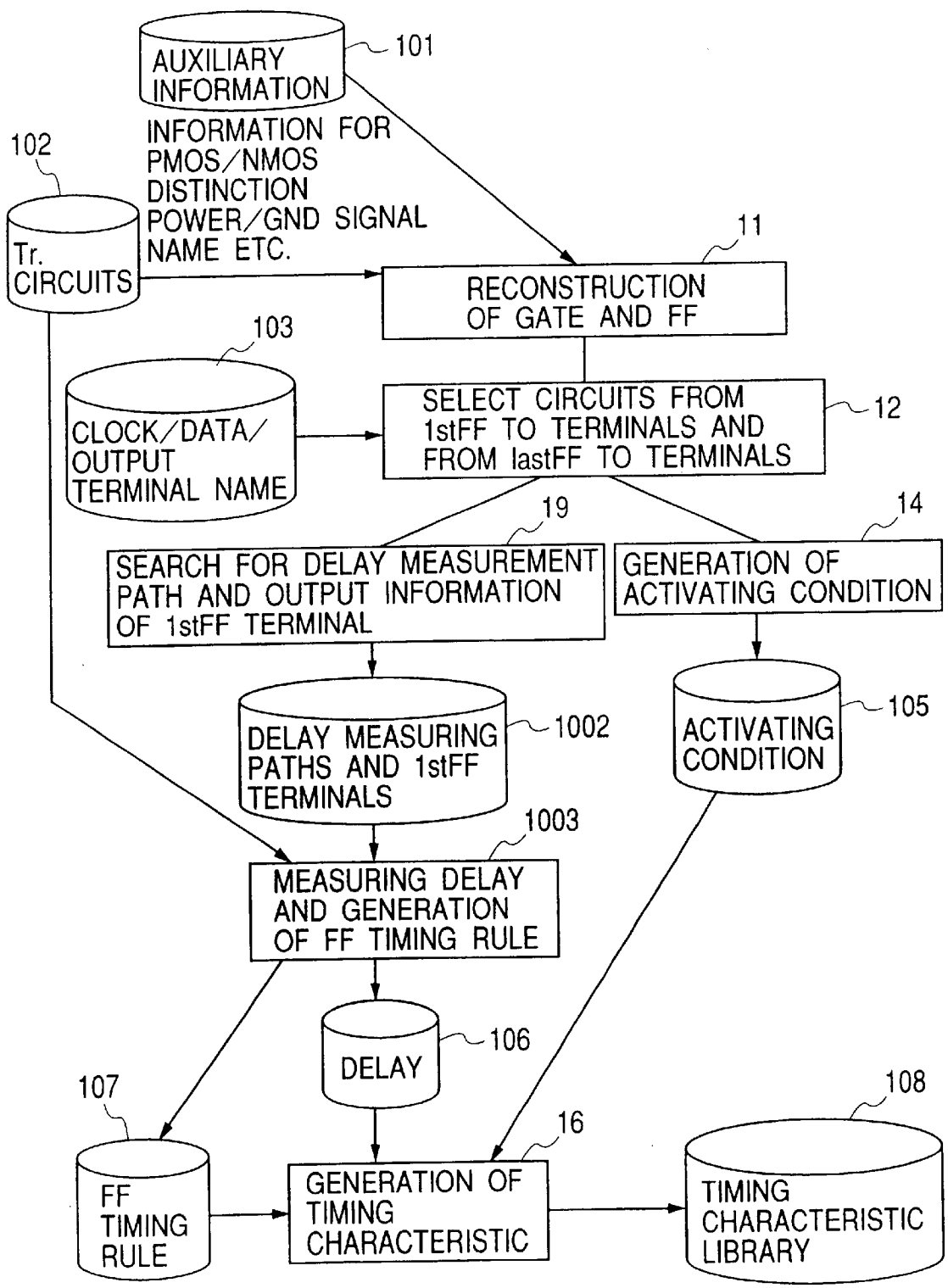
FIG. 23 is a flowchart showing the whole timing characteristic extracting method 6, FIG. 24 show components of an activating condition.

FIG. 23 shows a sixth embodiment and the sixth embodiment will be described below.

In this embodiment, processing for automatically calculating the bistable circuit timing rule 107 is added to the above embodiments.

In this embodiment, simultaneously when a delay measuring path is searched in the search of a delay measuring path 13, the input/output terminal information of the related first bistable circuit is also recognized and is output to the delay measuring path and the first bistable circuit 1002. Afterward, the bistable circuit timing rule 107 is also measured based upon the input/output terminal information of the first bistable circuit together with delay. In this measuring method, there is a well-known example of at least a method of using simulation and the description of the above measuring method is omitted.

10. Seventh Embodiment

FIG. 34 shows a seventh embodiment in relation to the simulation of the whole system including a module. FIG. 34(*a*) shows the system configuration of simulation. A library including module characteristics 22 which a characteristic extractor 10 generates can be generated as a logical hierarchy completely independent from a module function 21 owing to structural characteristics provided with independent logic for a timing activating condition (1), timing information directly set to the terminal of a module, a node detaching circuit for separating a timing attribute (3) and others. As the above separation is different from the separation of conventional type library data as representation and the above library data is a part of a logical hierarchy, it is not required to be changed to a format fit for a logical simulator by post-treatment and others. As in a method of representing a module function, it is also not required to consider characteristic information, the degree of freedom is extremely high.

FIG. 34(b) shows the format of the simulation of the whole system circuit. In the whole circuit in which the existing module such as MPU and a memory is mounted and to which new random logic is added, difference in time between data 111 from a system clock 110 and a random logic part and data 112 from another module and characteristic information such as setup time and hold time are compared 103 and if there is disobedience, an error is displayed in the result 40 of simulation. At this time, logic for a timing activating condition operates whether disobedience is required to be checked or not and if disobedience is not required to be checked, a pseudo error is inhibited.

High-speed precise simulation is enabled by combining a method of representing module characteristics according to the present invention, the description of operation and the description of a function.

INDUSTRIAL APPLICABILITY

As described above, according to the present invention, a timing characteristic library using which the timing verification of a large-scale circuit module can be more precisely executed at higher speed, compared with that in a conventional type can be provided. The present invention surmounts a problem that when a module is treated as a set of libraries including timing at a cell level using a conventional type timing verification method, it takes much simulation processing time in case timing verification is performed by simulation, and as there is no method of automatically extracting the timing of the whole module and the extraction of the timing depends upon manual labor when the module is represented by a functional model and the timing of the whole module to speed up simulation, a many manhour is required and precision is deteriorated. The present invention provides a method for solving the above problem, hereby, the timing of the whole module included in a timing characteristic library can be precisely extracted at high speed and as a result, a high-speed and precise verification method can be provided in timing verification. Further, as a generated timing characteristic library includes the condition fit for a timing rule, a pseudo error can be prevented from occurring when data not related to the module varies and the manhour of verification can be reduced.

What is claimed is:
1. A method of generating timing characteristic data of a circuit module from first circuit module data expressed by transistors, comprising the steps of:
constructing second circuit module data expressed by gate circuits and bistable circuits from the first circuit module data;
recognizing a first bistable circuit which is the first bistable circuit which would be reached by a signal applied to an input terminal of the circuit module, and recognizing a last bistable circuit which is the last bistable circuit which would have an effect upon a signal output from an output terminal of the circuit module;
searching for a first path, a first clock path, a second path and second clock path; the first path comprising gate circuits between the input terminal and the first bistable circuit, the first clock path comprising gate circuits between a clock terminal of the circuit module and the first bistable circuit, the second path comprising gate circuits between the last bistable circuit and the output terminal and the second clock path comprising gate circuits between the clock terminal and the last bistable circuit,
calculating an output delay of the circuit module based on a delay of the second path and a delay of the second clock path; and
calculating an input timing rule of the circuit module based on setup time and hold time of the bistable circuit, a delay of the first path and a delay of the first clock path.

2. A method according to claim 1, further comprising registering the output delay and the input timing rule of the circuit module as the timing characteristic data of the circuit module.

3. A method of generating a timing characteristic data according to claim 1, wherein the output delay and the input timing rule are registered in a timing characteristic library.

4. A method of generating a timing characteristic data according to claim 3, wherein the circuit module is a synchronized circuit and the bistable circuits are flip-flops.

5. A method of generating a timing characteristic data according to claim 1,
wherein the output delay is a time required to activate the last bistable circuit according to a clock signal input to the clock terminal and propagate a change of an output of the last bistable circuit to the output terminal.

6. A method of generating a timing characteristic data according to claim 1,
wherein the input timing rule of the circuit module includes a setup time of input and a hold time of input, the setup time of input is defined that the setup time of the-first bistable circuit+(the delay of the first path−the delay of the first clock path) and the hold time of input is defined that the hold time of the first bistable circuit+ (the delay of the first path−the delay of the first clock path).

* * * * *